(12) United States Patent
Lee et al.

(10) Patent No.: US 11,183,497 B2
(45) Date of Patent: Nov. 23, 2021

(54) SEMICONDUCTOR DEVICES

(71) Applicant: Samsung Electronics Co., Ltd., Suwon-si (KR)

(72) Inventors: Jae-Boong Lee, Yongin-si (KR); Jae-Ho Park, Suwon-si (KR); Sang-Hoon Baek, Seoul (KR); Ji-Su Yu, Seoul (KR); Seung-Young Lee, Seoul (KR); Jong-Hoon Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 36 days.

(21) Appl. No.: 16/531,327

(22) Filed: Aug. 5, 2019

(65) Prior Publication Data

US 2020/0243523 A1    Jul. 30, 2020

(30) Foreign Application Priority Data

Jan. 25, 2019   (KR) ........................ 10-2019-0009725

(51) Int. Cl.
  *H01L 27/092* (2006.01)
  *H01L 29/06* (2006.01)
  *H01L 27/02* (2006.01)

(52) U.S. Cl.
  CPC ...... *H01L 27/0924* (2013.01); *H01L 29/0646* (2013.01); *H01L 27/0207* (2013.01)

(58) Field of Classification Search
  CPC ..... H01L 21/823431; H01L 21/823821; H01L 27/0207; H01L 27/0886; H01L 27/0924; H01L 29/0646
  See application file for complete search history.

(56) References Cited

U.S. PATENT DOCUMENTS

| 9,209,178 | B2 | 12/2015 | Kanakasabapathy et al. |
| 9,831,272 | B2 | 11/2017 | Chen et al. |
| 9,865,704 | B2 | 1/2018 | Xie et al. |
| 10,103,172 | B2 | 10/2018 | Agarwal et al. |
| 2015/0294969 | A1* | 10/2015 | Lee ..................... H01L 29/7855 257/401 |
| 2017/0200651 | A1 | 7/2017 | Lee et al. |
| 2017/0371995 | A1 | 12/2017 | Correale, Jr. et al. |
| 2018/0122804 | A1 | 5/2018 | Jain et al. |
| 2018/0234281 | A1 | 8/2018 | Dezfooliyan et al. |
| 2019/0355719 | A1* | 11/2019 | Maeda ............ H01L 21/823821 |
| 2019/0355729 | A1* | 11/2019 | Liaw ................... H01L 27/0207 |

* cited by examiner

*Primary Examiner* — Allan R Wilson
(74) *Attorney, Agent, or Firm* — Harness, Dickey & Pierce, P.L.C.

(57) ABSTRACT

A semiconductor device includes first group active fins and a first diffusion prevention pattern. The first group active fins are spaced apart from each other in a second direction, and each of the first group active fins extends in a first direction different from the second direction on a first region of a substrate including the first region and a second region. The first diffusion prevention pattern extends on the first region of the substrate in the second direction through the first group active fins. The first group active fins include first and second active fins. The first diffusion prevention pattern extends through a central portion of the first active fin in the first direction to divide the first active fin, and extends through and contacts an end of the second active fin in the first direction.

19 Claims, 35 Drawing Sheets

90

SEMICONDUCTOR DEVICES

CROSS-REFERENCE TO RELATED APPLICATION

This application claims priority under 35 USC § 119 to Korean Patent Application No. 10-2019-0009725, filed on Jan. 25, 2019 in the Korean Intellectual Property Office (KIPO), the contents of which are herein incorporated by reference in their entirety.

BACKGROUND

1. Field

Example embodiments of the inventive concepts relate to semiconductor devices. More particularly, example embodiments of the inventive concepts relate to semiconductor devices including a diffusion prevention pattern.

2. Description of the Related Art

In order to electrically isolate neighboring standard cells of a semiconductor device, a diffusion prevention pattern may be formed. The diffusion prevention pattern may be formed by forming active fins and removing some of the active fins, or removing a gate structure and some of the active fins under the gate structure. At a boundary area between neighboring cells at which the diffusion prevention pattern is formed, a width of an active region on which active fins may be formed may decrease so that the number of active fins on the active region may change, and thus the characteristics of the active fins may change due to a local layout effect (LLE).

SUMMARY

Example embodiments provide a semiconductor device having enhanced characteristics.

According to some example embodiments, there is provided a semiconductor device including first group active fins on a first region of a substrate, spaced apart from each other in a second direction, each of the first group active fins extending in a first direction, the first and second directions being different from each other and the substrate including the first region and a second region, and a first diffusion prevention pattern on the first region of the substrate extending in the second direction through the first group active fins, wherein the first group active fins include first and second active fins, and the first diffusion prevention pattern extends through a central portion of the first active fin in the first direction dividing the first active fin, and extends through and contacts an end of the second active fin in the first direction.

According to some example embodiments, there is provided a semiconductor device including an active region on a substrate extending in a first direction and including a first portion, a second portion and a third portion the first portion having a first width in a second direction substantially perpendicular to the first direction, the second portion having a second width in the second direction less than the first width, and the third portion being between the first and second portions and having a third width in the second direction less than the first width and more than the second width, a first active fin on the first to third portions of the active region extending in the first direction to a first length, and a second active on the first portion of the active region extending in the first direction to a second length less than the first length, wherein a distance in the second direction from a sidewall of the third portion of the active region to the first active fin is greater than a distance in the second direction from a sidewall of each of the first and second portions of the active region to the first active fin.

According to some example embodiments, there is provided a semiconductor device including first group active fins on a first region of a substrate spaced apart from each other in a second direction, each of the first group active fins extending in a first direction, the first and second directions being different from each other, and the substrate including the first region and a second region, the first group active fins comprising a first active fin and a second active fin, a first diffusion prevention pattern on the first region of the substrate extending in the second direction through a central portion of the first active fin, dividing the first active fin in the first direction, and extending through an end of the second active fin in the first direction, and a second diffusion prevention pattern on the first region of the substrate extending in the second direction, the second diffusion prevention pattern contacting a sidewall of the first diffusion prevention pattern, wherein a bottom of the second diffusion prevention pattern is closer to the substrate in a third direction than a bottom of the first diffusion prevention pattern, and a top surface of the second diffusion prevention pattern is further from the substrate in the third direction than a top surface of the first diffusion prevention pattern, the third direction being substantially perpendicular to a surface of the substrate.

The semiconductor device in accordance with the inventive concepts may reduce or prevent the instability of the characteristics due to the LLE. Additionally, the electrical short at an area having a varying width between neighboring conductive structures may be reduced or prevented. Furthermore, the diffusion prevention pattern that may be formed by removing the gate structure may be formed not only in the PMOS region but also in the NMOS region, so that the leakage current due to the dummy gate structure may be reduced or prevented.

DETAILED DESCRIPTION

Example embodiments will be more clearly understood from the following detailed description taken in conjunction with the accompanying drawings. Hereinafter, two directions substantially parallel to an upper surface of a substrate and crossing each other may be referred to as first and second directions, respectively, and a direction substantially perpendicular to the upper surface of the substrate may be referred to as a third direction. In some example embodiments, the first and second directions may be substantially perpendicular to each other.

Figure 1:
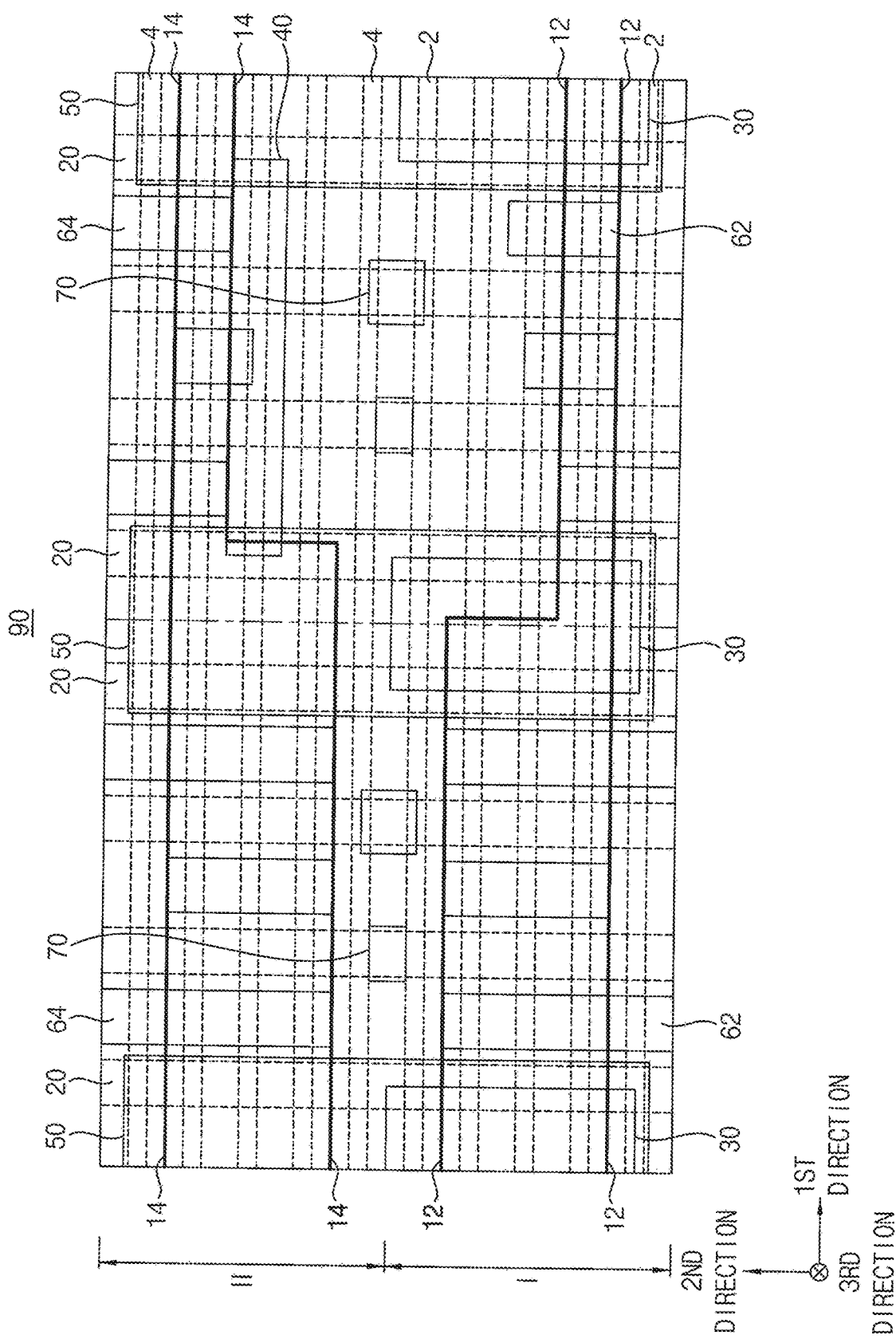
FIG. 1 is a plan view illustrating a mask including layouts of some elements of a semiconductor device in accordance with some example embodiments.

FIG. 1 is a plan view illustrating a mask including layouts of some elements of a semiconductor device in accordance with some example embodiments.

Referring to FIG. 1, a mask 90 may include two cells neighboring in the first direction, and may include first and second regions I and II neighboring in the second direction. A boundary between the cells is shown in a dotted line extending in the second direction.

In some example embodiments, the mask 90 may include first and second active fins 2 and 4, first and second active regions 12 and 14, a gate structure 20, a first diffusion prevention pattern 30, an insulation pattern 40, a second diffusion prevention pattern 50, first and second contact plugs 62 and 64, and/or a third contact plug 70.

In order to avoid the complexity of drawings, layouts of only some of the main elements that may be formed in each cell are shown. The layouts of the elements may be designed with one or a plurality of masks, and only one mask 90 is shown in the drawings. For example, the layouts of the elements may be designed with a plurality of masks that may vertically overlap with each other in consideration of layers at which the elements may be respectively formed.

The first and second active fins 2 and 4 may extend in the first direction in the first and second regions I and II, respectively. A plurality of first active fins 2 may be spaced apart from each other in the second direction, and a plurality of second active fins 4 may be spaced apart from each other in the second direction.

The gate structure 20 may extend in the second direction in the first and second regions I and II to overlap the first and second active fins 2 and 4, and a plurality of gate structures 20 may be spaced apart from each other in the first direction.

The first and second active fins 2 and 4 and the gate structure 20 are shown in dotted lines in the drawings.

The first and second active regions 12 and 14 may extend in the first direction in the first and second regions I and II, respectively, and may include at least portions of the first and second active fins 2 and 4, respectively. In some example embodiments, the first active region 12 may include a first portion having a first width in the second direction, and a second portion having a second width less than the first width in the second direction. Likewise, the second active region 14 may include a first portion having a third width in the second direction, and a fourth width less than the third width in the second direction.

In some example embodiments, a first boundary between the first and second portions of the first active region 12 may be formed between two of the gate structures 20 neighboring in the first direction, and a second boundary between the first and second portions of the second active region 14 may overlap one of the two neighboring gate structures 20. Thus, the first and second boundaries may not be aligned with each other in the second direction.

As will be illustrated later, the second boundary between the first and second portions of the second active region 14, that is, a portion of the second active region 14 of which a width rapidly decreases, may be formed to overlap one of the two gate structures 20 neighboring in the first direction instead of being formed therebetween. A local layout effect (LLE) may decrease so that characteristics (e.g., capacitance) of the second active fins 4 on the second active region 14 may be stabilized.

The first diffusion prevention pattern 30 may extend in the second direction, and may include the boundary between the cells therein in the first region I. In some example embodiments, the first diffusion prevention pattern 30 may include the first boundary between the first and second portions of the first active region 12 therein, and an extension length of the first diffusion prevention pattern 30 in the second direction may be less than half of an extension length of the gate structure 20 in the second direction. Additionally, the first diffusion prevention pattern 30 may at least partially overlap the two gate structures 20 neighboring in the first direction. A plurality of first diffusion prevention patterns 30 may be spaced apart from each other in the first direction.

The second diffusion prevention pattern 50 may extend in the second direction, and may include the boundary between the cells therein in the first and second regions I and II. In some example embodiments, the second diffusion prevention pattern 50 may include the first diffusion prevention pattern 30 therein, and an extension length of the second diffusion prevention pattern 50 in the second direction may be less than the extension length of the gate structure 20 in the second direction. Additionally, the second diffusion prevention pattern 50 may cover the two gate structures 20 neighboring in the first direction. A plurality of second diffusion prevention patterns 50 may be spaced apart from each other in the first direction.

As will be illustrated later, the second diffusion prevention pattern 50 may fill a recess that may be formed by removing the gate structure 20 and portions of the first and second active fins 2 and 4 thereunder. Thus, the second diffusion prevention pattern 50 may be formed not only in the first region I but also in the second region II, so that a dummy gate structure remaining on the first diffusion prevention pattern 30 may be also removed. Accordingly, leakage current due to the dummy gate structure may be reduced or prevented.

In some example embodiments, the insulation pattern 40 may overlap the first portion adjacent to the second portion of the second active region 14 in the second region II, and may contact an edge of the second portion of the second region to extend in the first direction. The insulation pattern 40 may overlap an edge of each of two second diffusion prevention patterns 50 neighboring in the first direction.

As will be illustrated later, the insulation pattern 40 may fill a recess that may be formed by removing a portion of the second active fin 4 remaining on the first portion adjacent the second portion of the second active region 14. Thus, a parasitic source/drain layer may be reduced or prevented from being formed on the remaining second active fin 4, so that electrical short due to the parasitic source/drain layer may be reduced or prevented.

The first contact plug 62 may extend in the second direction in the first region I to overlap one or ones of the first active fins 2, and the second contact plug 64 may extend in the second direction in the second region II to overlap one or ones of the second active fins 4.

The third contact plug 70 may overlap the gate structure 20. In some example embodiments, the third contact plug 70 may be formed at a boundary between the first and second regions I and II.

FIGS. 2 to 6 are plan views illustrating masks including layouts of some elements of a semiconductor device in accordance with some example embodiments. These masks may be substantially the same as or similar to that of FIG.

1, except for some elements. Thus, like reference numerals refer to like elements, and repetitive detailed descriptions thereon are omitted herein.

Figure 2:
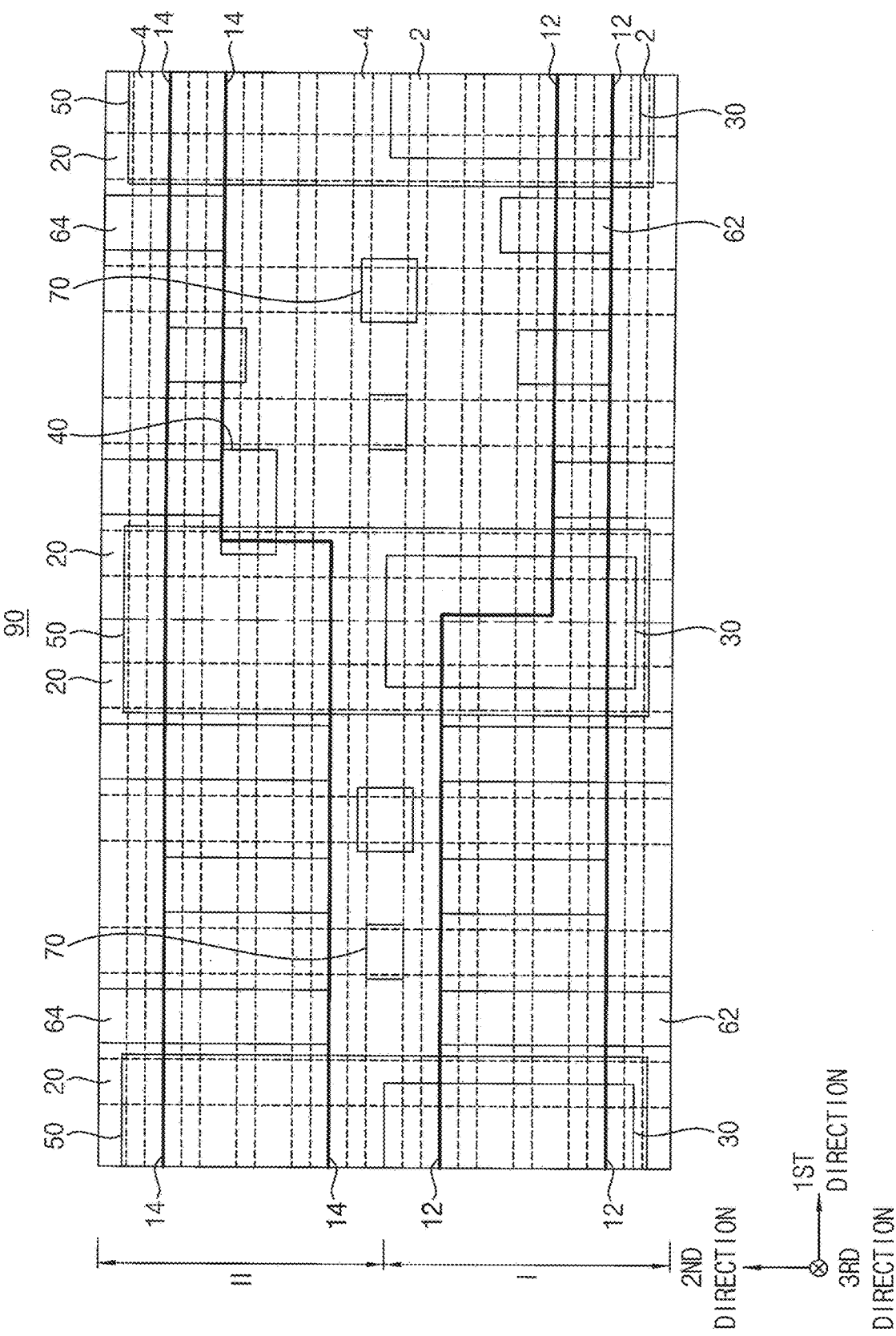
FIGS. 2 to 6 are plan views illustrating masks including layouts of some elements of a semiconductor device in accordance with some example embodiments.

Referring to FIG. 2, the insulation pattern 40 may overlap the first portion adjacent the second portion of the second active region 14 in the second region II, and may contact an edge of the second portion of the second active region 14 to extend to a given length in the first direction. However, the insulation pattern 40 may overlap an edge of only one second diffusion prevention pattern 50, and may not extend to another second diffusion prevention pattern 50 neighboring in the first direction.

The insulation pattern 40 may reduce or prevent an electrical short with other conductive structures by removing a portion of the second active fin 4 remaining on the first portion adjacent the second portion of the second active region 14, and thus the electrical short may be reduced or prevented even if the insulation pattern 40 does not overlap each of an edge of the two neighboring second diffusion prevention patterns 50.

Figure 3:
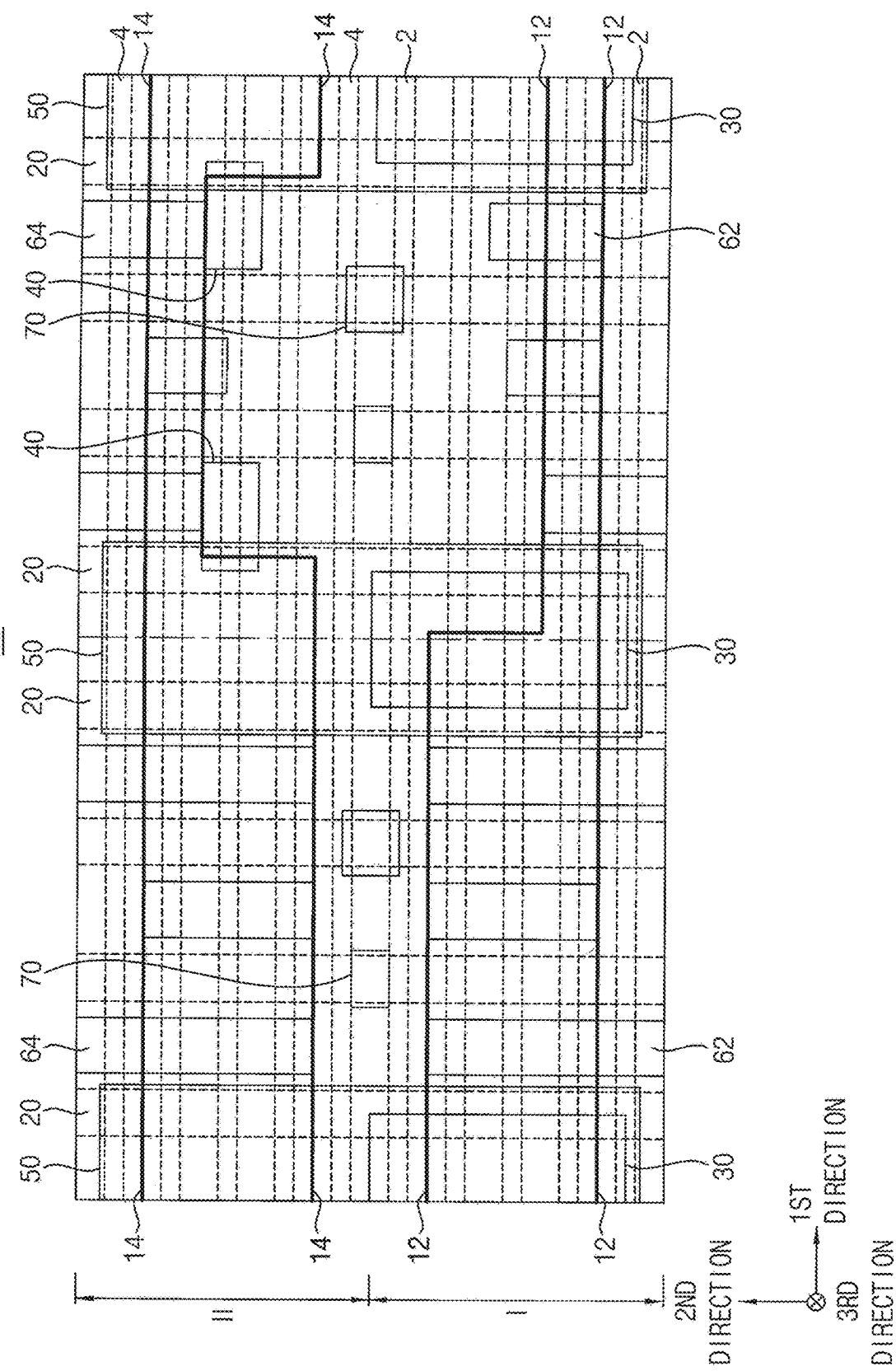

Referring to FIG. 3, when the second active region 14 has an area of which a width rapidly changes in addition to the area adjacent to the boundary between the first and second portions, the insulation pattern 40 may also cover that area.

Figure 4:
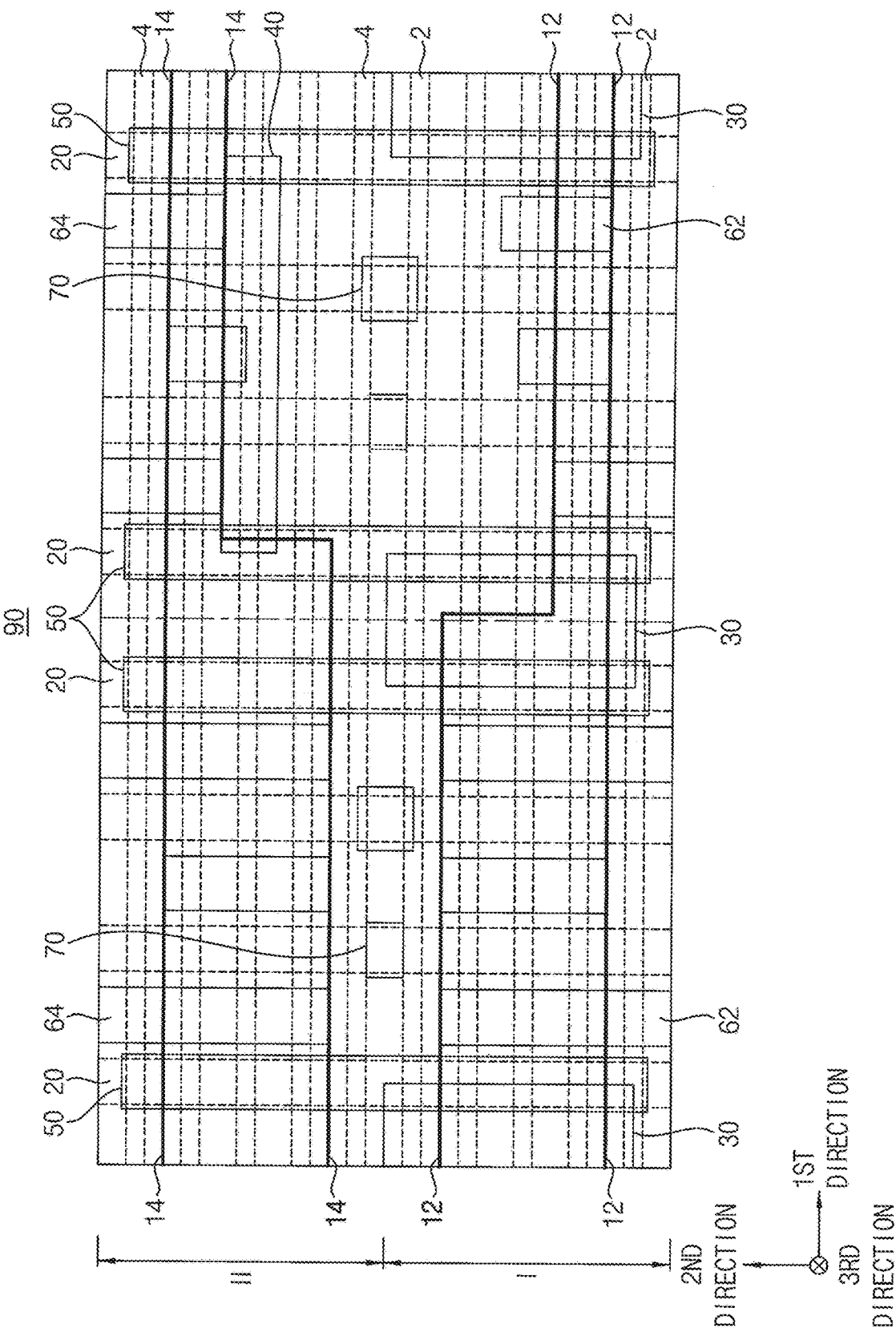

Referring to FIG. 4, the second diffusion prevention pattern 50 may include the boundary between the cells therein in the first and second regions I and II, and may extend in the second direction. Further, the second diffusion prevention pattern 50 may cover two gate structures 20 neighboring in the first direction. However, unlike that of FIG. 1, the second diffusion prevention pattern 50 may cover only the two gate structures 20, and may not cover the first and second active fins 2 and 4 therebetween.

The second diffusion prevention pattern 50 may be formed in order to remove the gate structures 20 and portions of the first and second active fins 2 and 4 thereunder, and thus may not cover the first and second active fins 2 and 4 between the gate structures 20.

Figure 5:
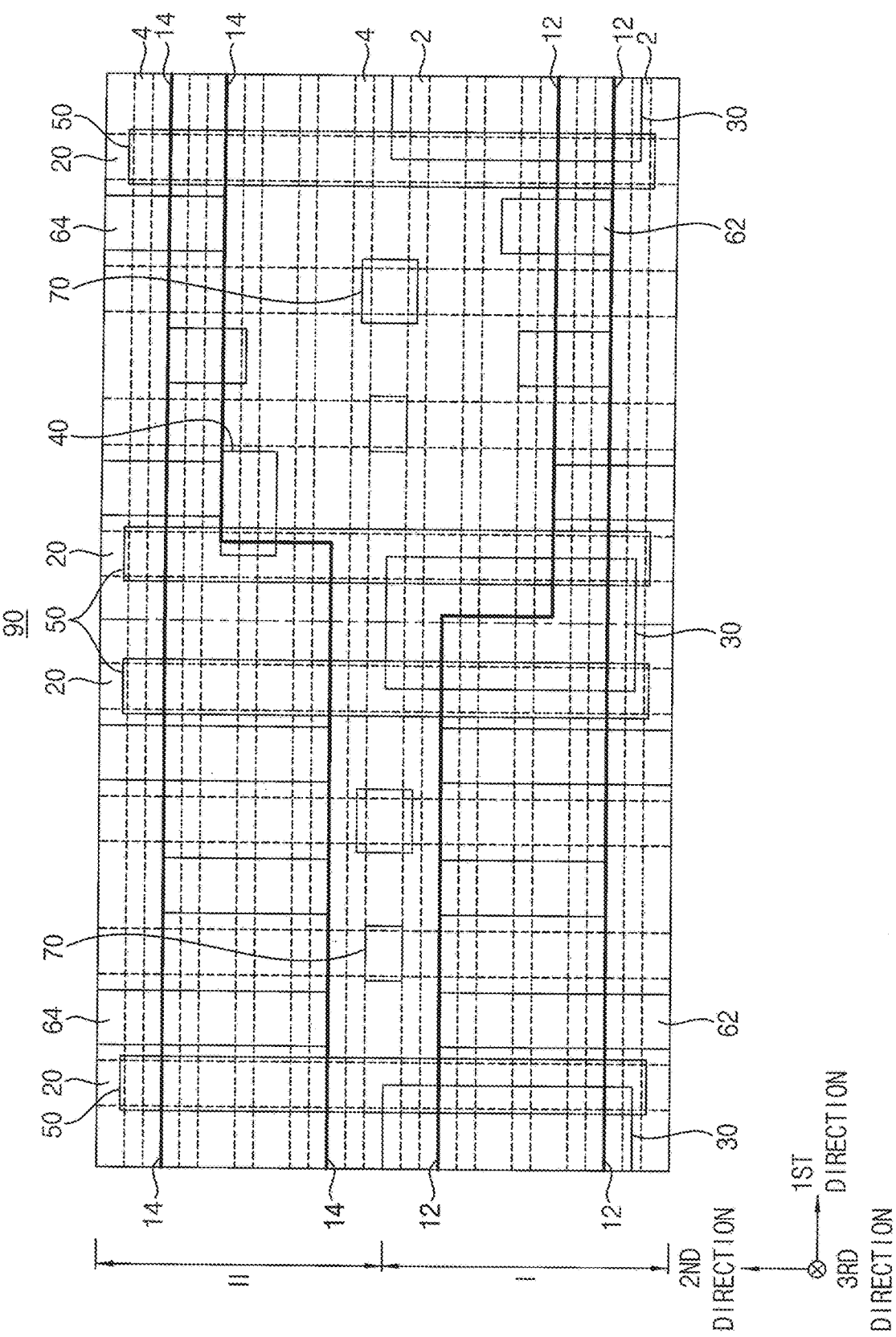

Referring to FIG. 5, the second diffusion prevention pattern 50 may cover only the two gate structures 20, as that of FIG. 4. Additionally, the second diffusion prevention pattern 50 may overlap only one second diffusion prevention pattern 50, and may not extend to another second diffusion prevention pattern 50 neighboring in the first direction, as that of FIG. 2.

Figure 6:
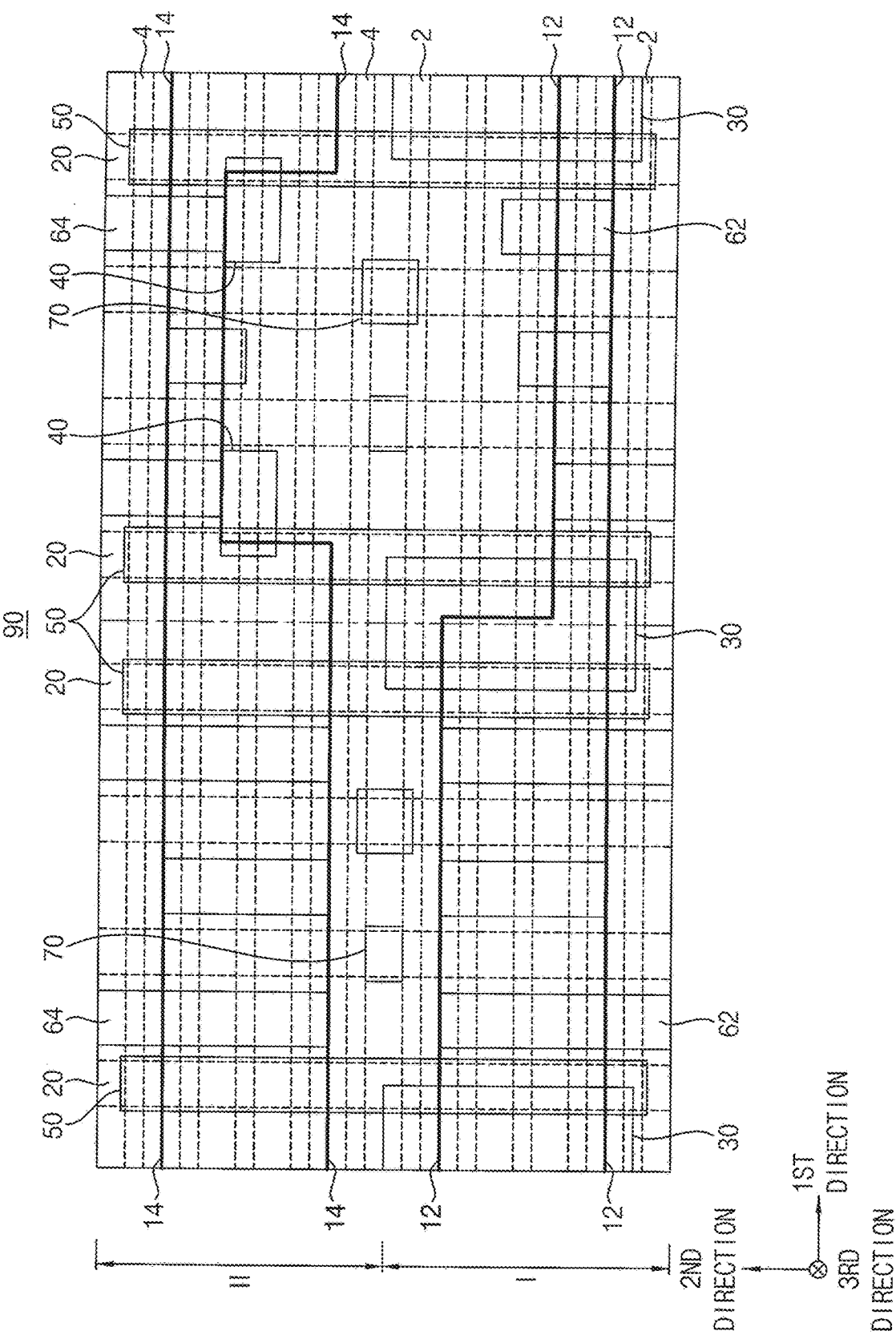

Referring to FIG. 6, the second diffusion prevention pattern 50 may cover only the two gate structures 20, as that of FIG. 4. Additionally, when the second active region 14 has an area of which a width rapidly changes in addition to the area adjacent to the boundary between the first and second portions, the insulation pattern 40 covering the area may be further formed.

FIGS. 7 to 31 are plan views and cross-sectional views illustrating stages of a method of manufacturing a semiconductor device in accordance with some example embodiments. Particularly, FIGS. 7, 9, 11, 13, 16, 21, 25 and 27 are the plan views, and FIGS. 8, 10, 12, 14-15, 17-20, 22-24, 26 and 28-31 are the cross-sectional views.

Figure 8:
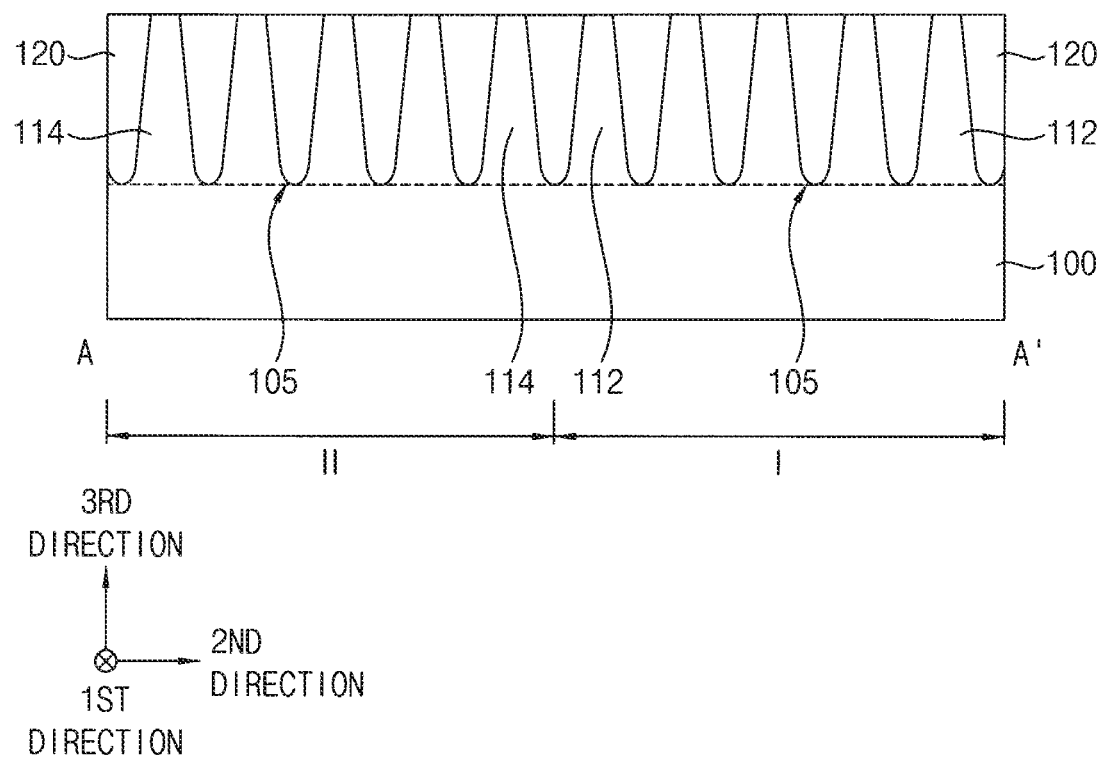
Figure 12:
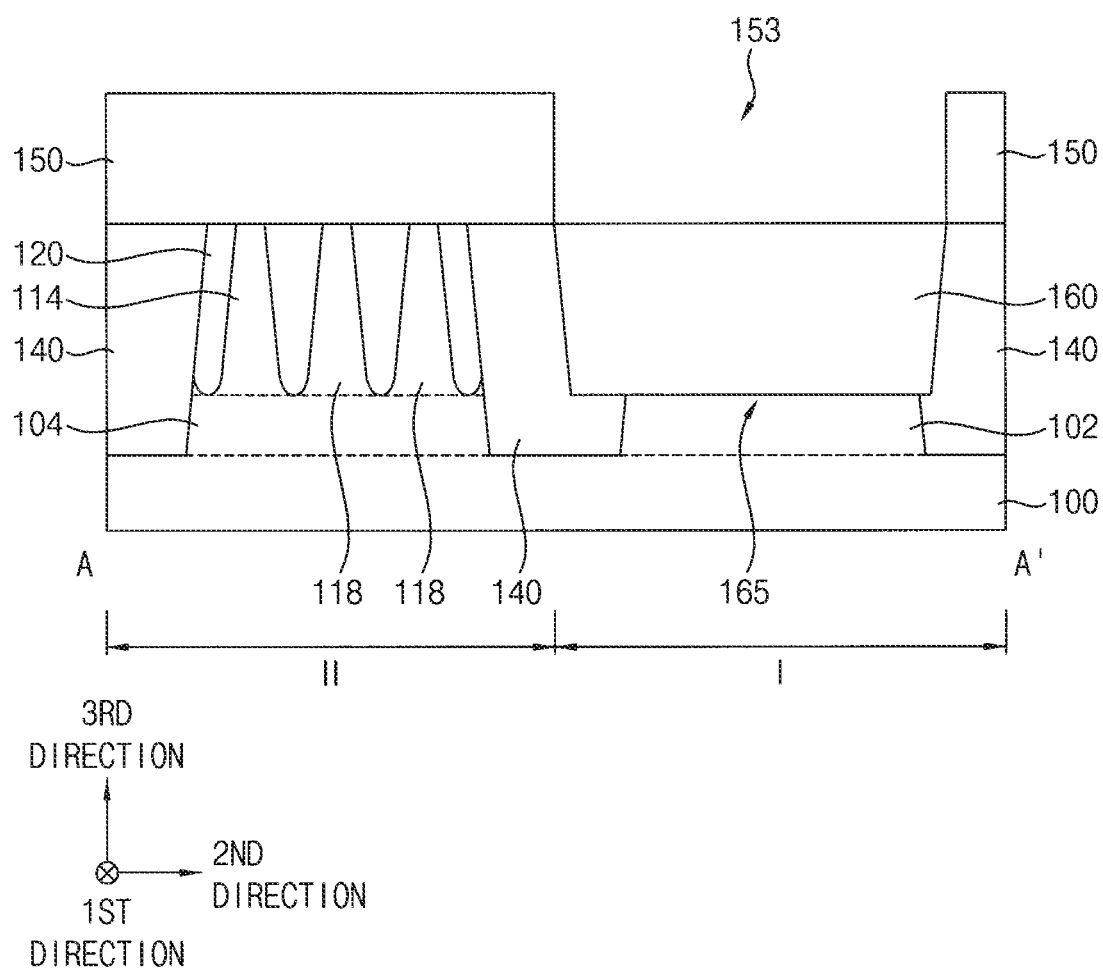
Figure 17:
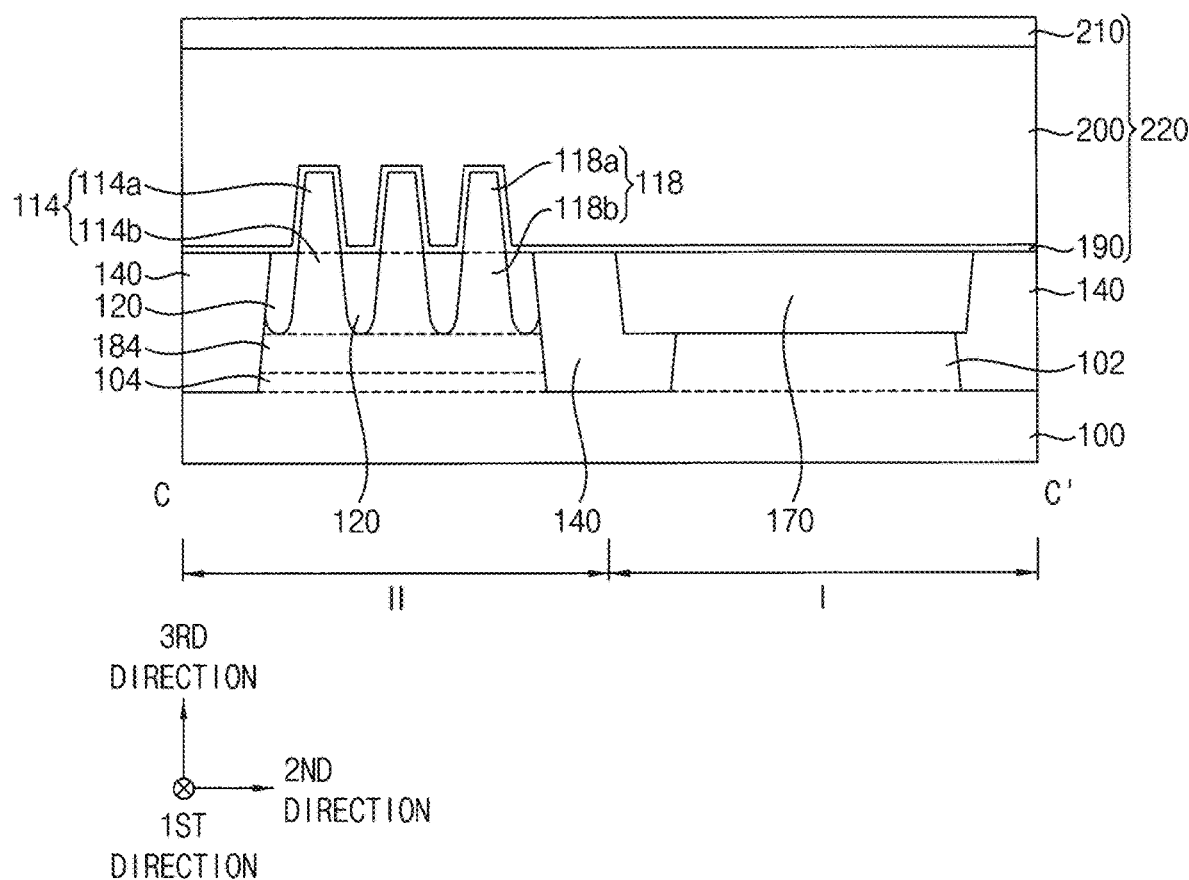
Figure 18:
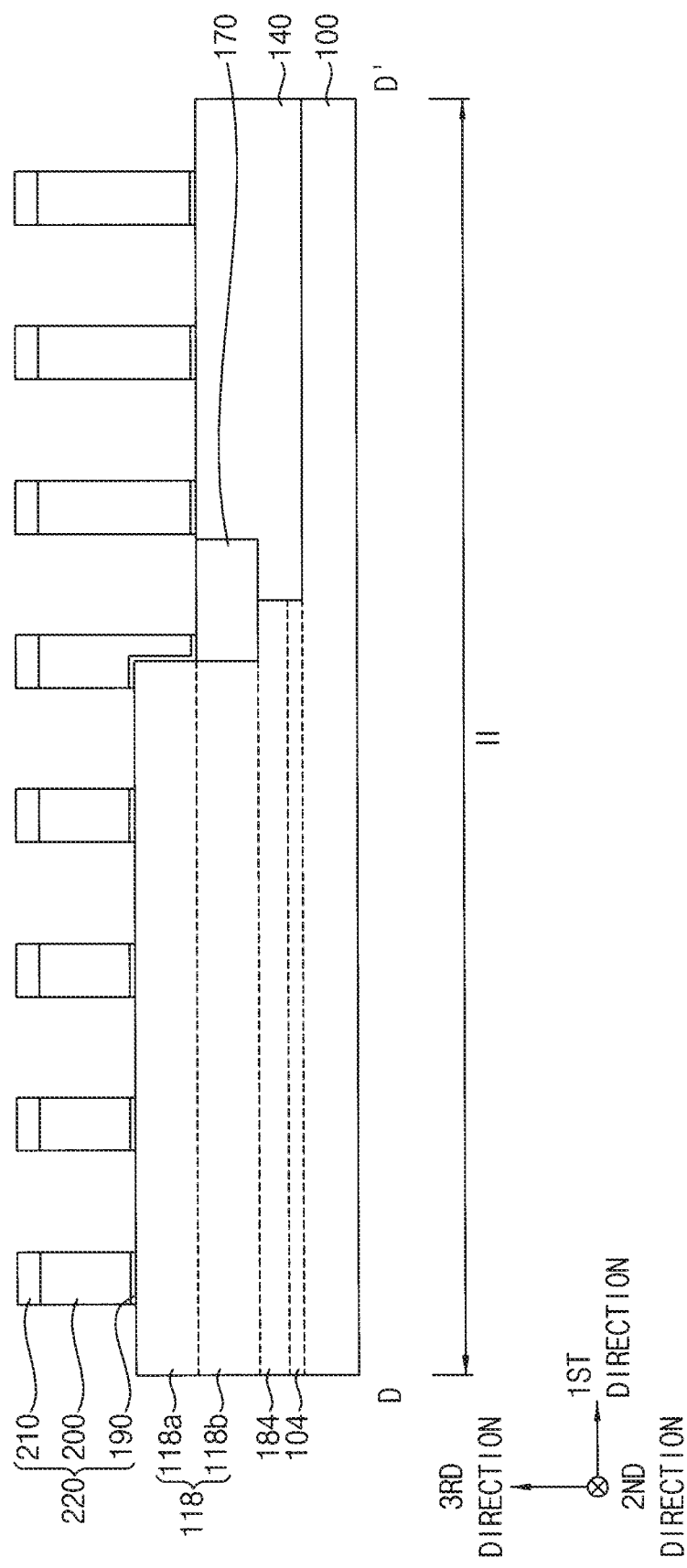
Figure 28:
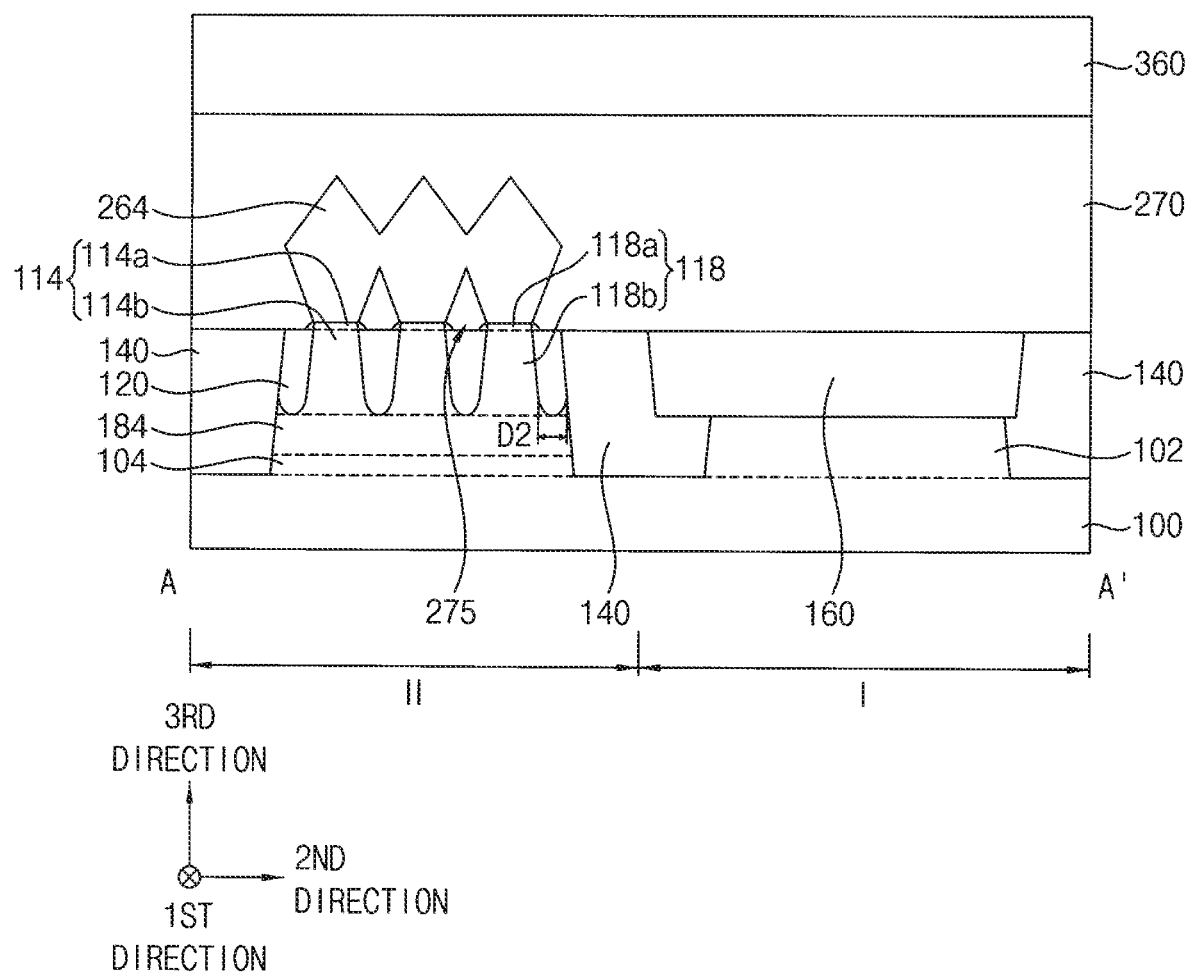
Figure 29:
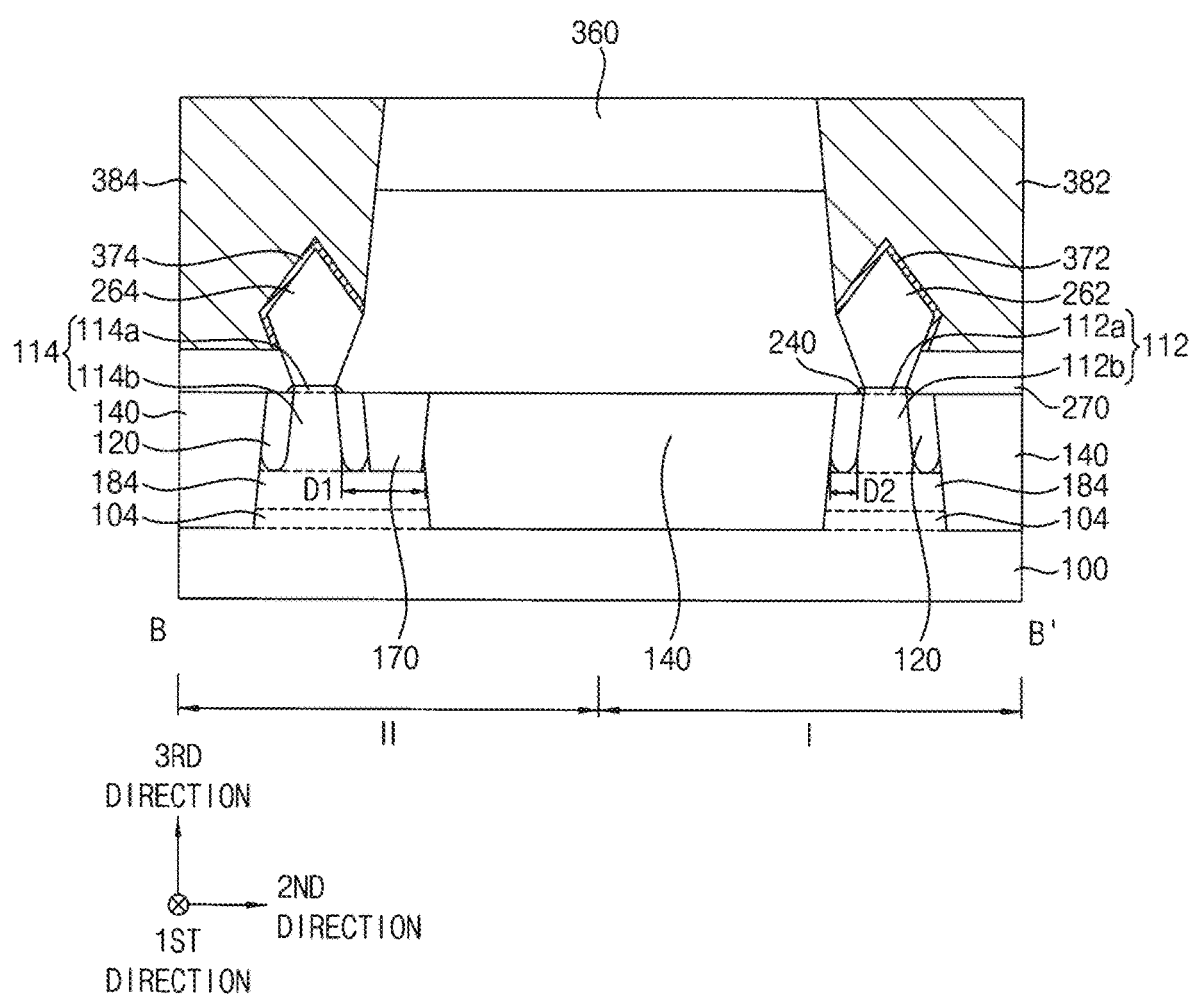
Figure 30:
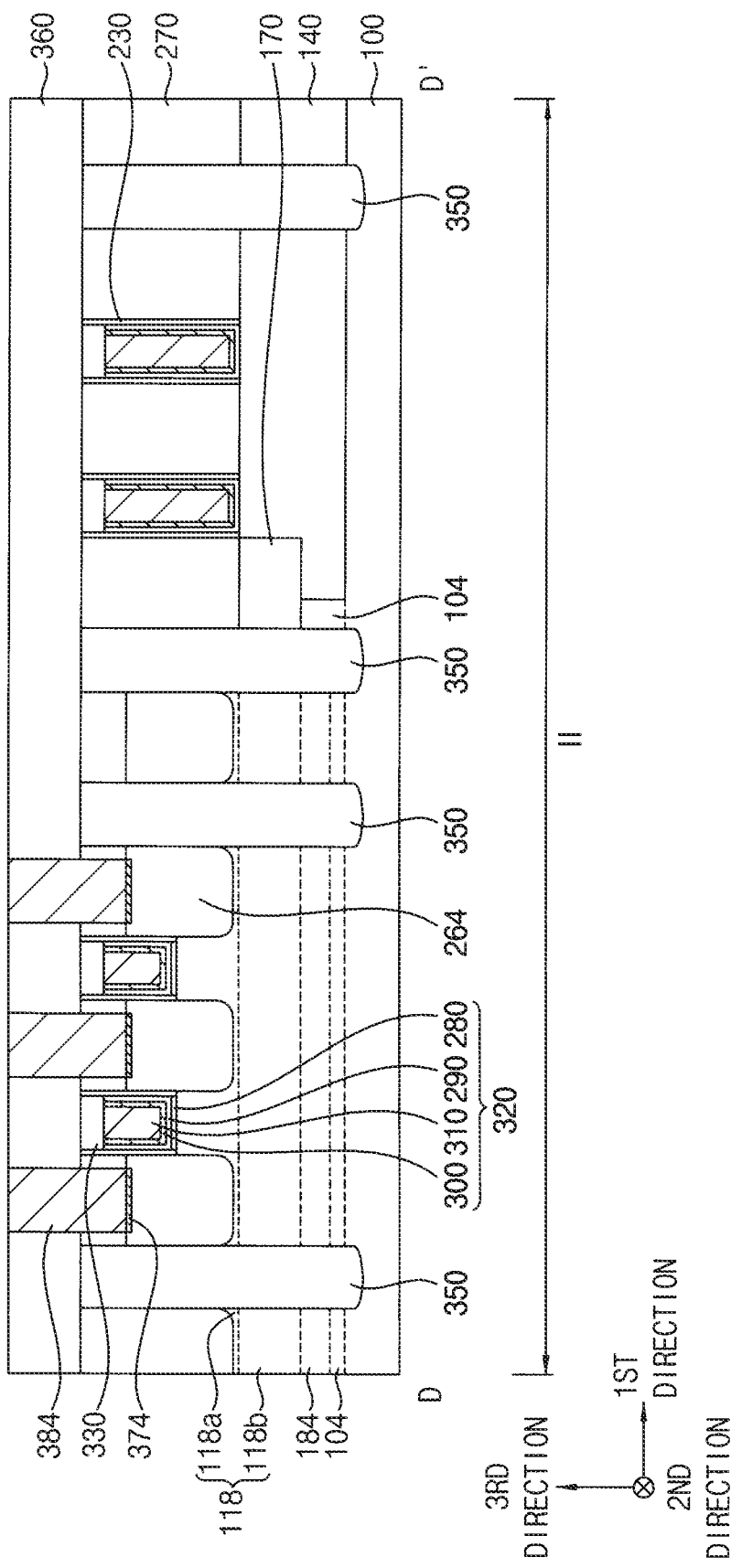
Figure 31:
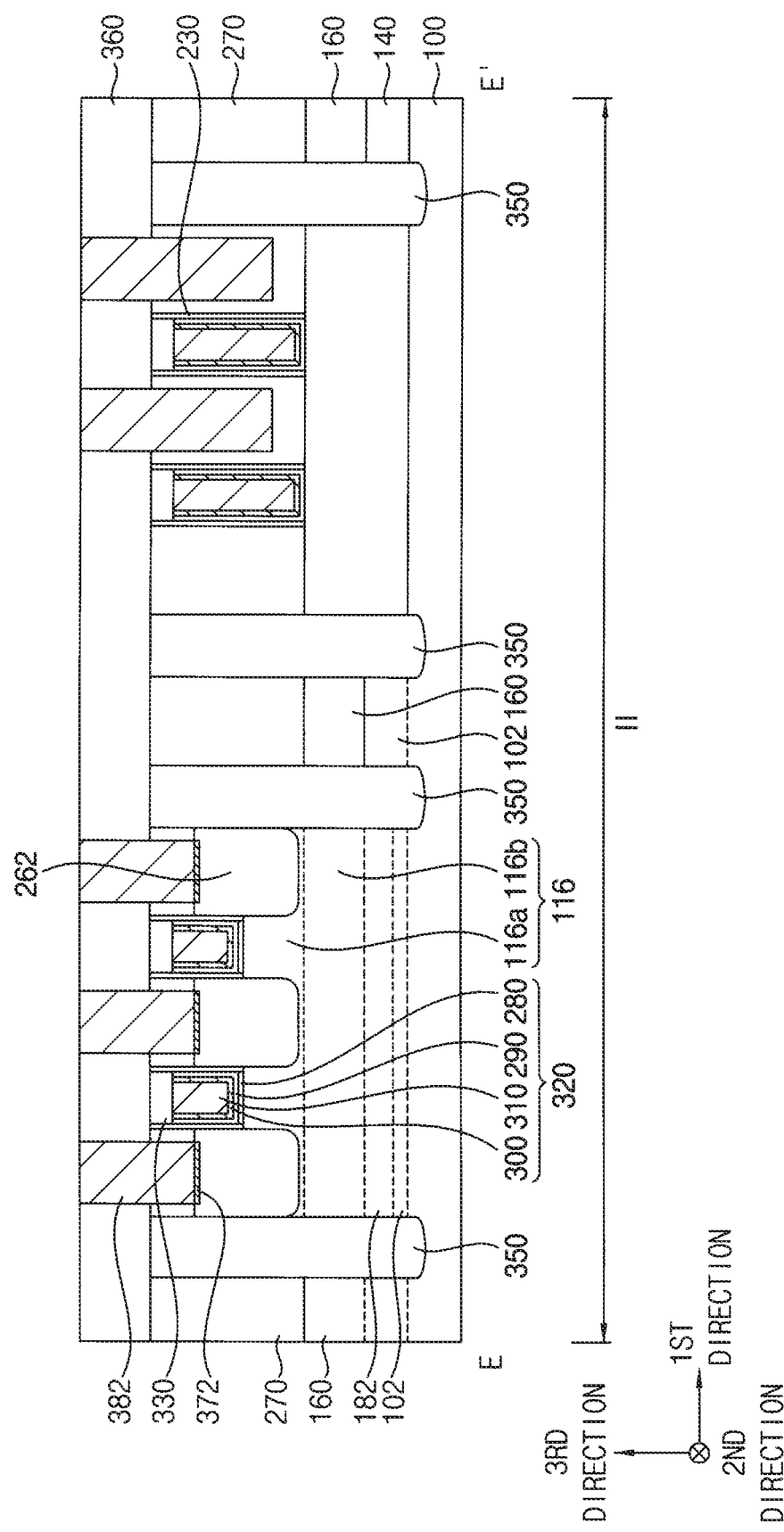

FIGS. 8, 12 and 28 are cross-sectional views taken along lines A-A' of corresponding plan views, FIGS. 10, 14-15, 19, 22 and 29 are cross-sectional views taken along lines B-B' of corresponding plan views, FIG. 17 is a cross-sectional view taken along a line C-C' of a corresponding plan view, FIGS. 18, 20, 23-24, 26 and 30 are cross-sectional views taken along lines D-D' of corresponding plan views, and FIG. 31 is a cross-sectional view taken along a line E-E' of a corresponding plan view.

The method, according to some example embodiments, may be performed using the mask illustrated with reference to FIG. 5. However, the inventive concepts may not be limited thereto, and the method may be performed using those illustrated with reference to FIGS. 1 to 4 or FIG. 6.

Figure 7:
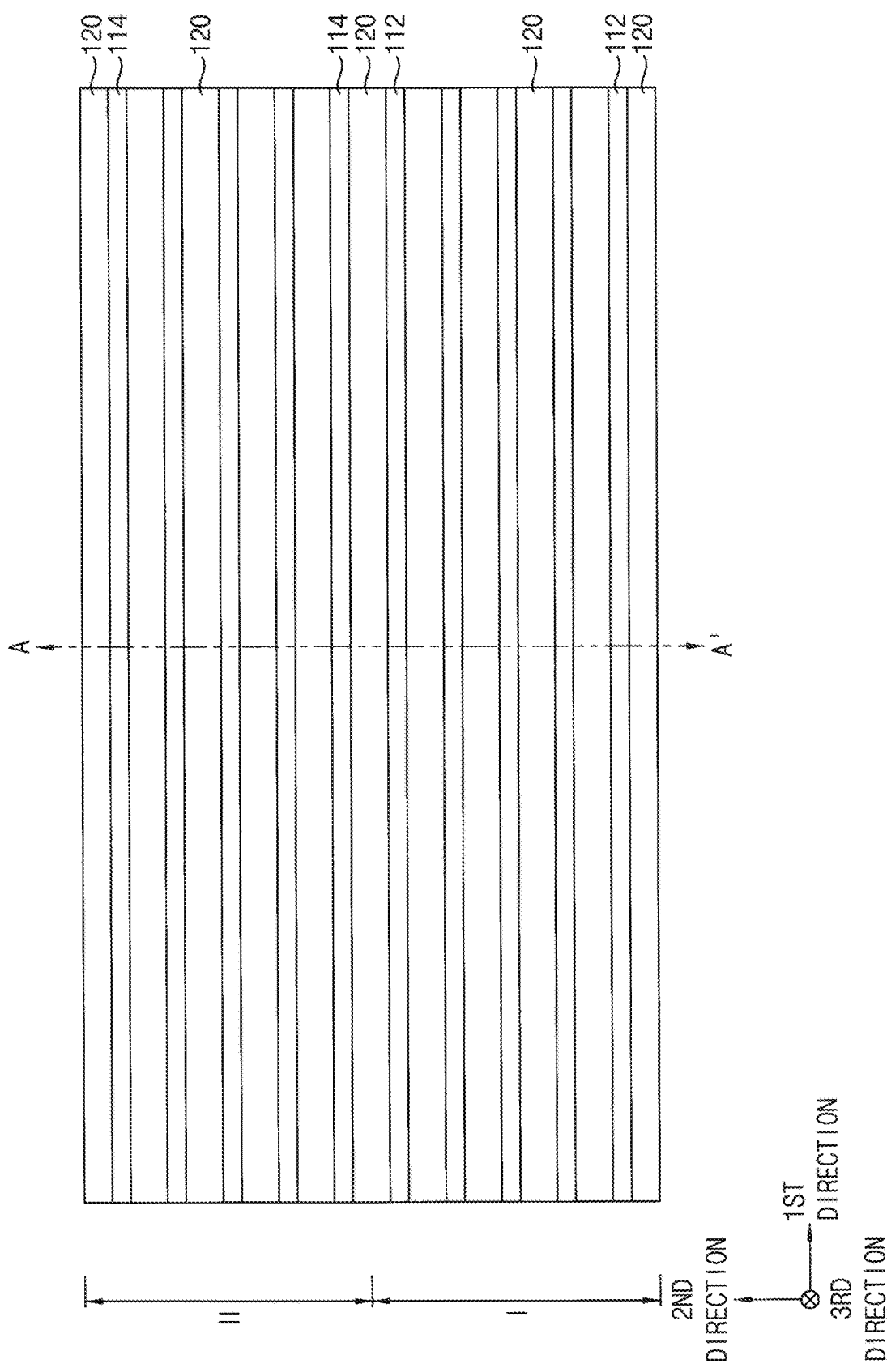
FIGS. 7 to 31 are plan views and cross-sectional views illustrating stages of a method of manufacturing a semiconductor device in accordance with some example embodiments.

Referring to FIGS. 7 and 8, an upper portion of a substrate 100 including first and second regions I and II may be partially removed to form a first recess 105, and thus first and second active fins 112 and 114 protruding from the substrate 100 may be formed in the first and second regions I and II, respectively.

The substrate 100 may include semiconductor materials, e.g., silicon, germanium, silicon-germanium, etc., and/or III-V compounds e.g., GaP, GaAs, GaSb, etc. In some example embodiments, the substrate 100 may be a silicon-on-insulator (SOI) substrate or a germanium-on-insulator (GOI) substrate.

Hereinafter, a lower portion of the substrate 100, that is, only a portion of the substrate 100 under bottoms of the first and second active fins 112 and 114 may be referred to as the substrate 100 in order to be differentiated from the first and second active fins 112 and 114.

In some example embodiments, the first region I of the substrate 100 may be a negative-channel metal oxide semiconductor (NMOS) region in which NMOS transistors may be formed, and the second region II of the substrate 100 may be a positive-channel metal oxide semiconductor (PMOS) region in which PMOS transistors may be formed. The first and second regions I and II may be disposed in the second direction.

In some example embodiments, each of the first and second active fins 112 and 114 may extend in the first direction to a first length, and a plurality of first active fins 112 and a plurality of second active fins 114 may be spaced apart from each other in the second direction.

A first isolation layer may be formed on the substrate 100 to cover the first and second active fins 112 and 114, and may be planarized until upper surfaces of the first and second active fins 112 and 114 may be exposed to form a first isolation pattern 120 covering sidewalls of the first and second active fins 112 and 114. The first isolation pattern 120 may include an oxide, e.g., silicon oxide.

In some example embodiments, the planarization process may be performed by a chemical mechanical polishing (CMP) process and/or an etch back process.

Figure 9:
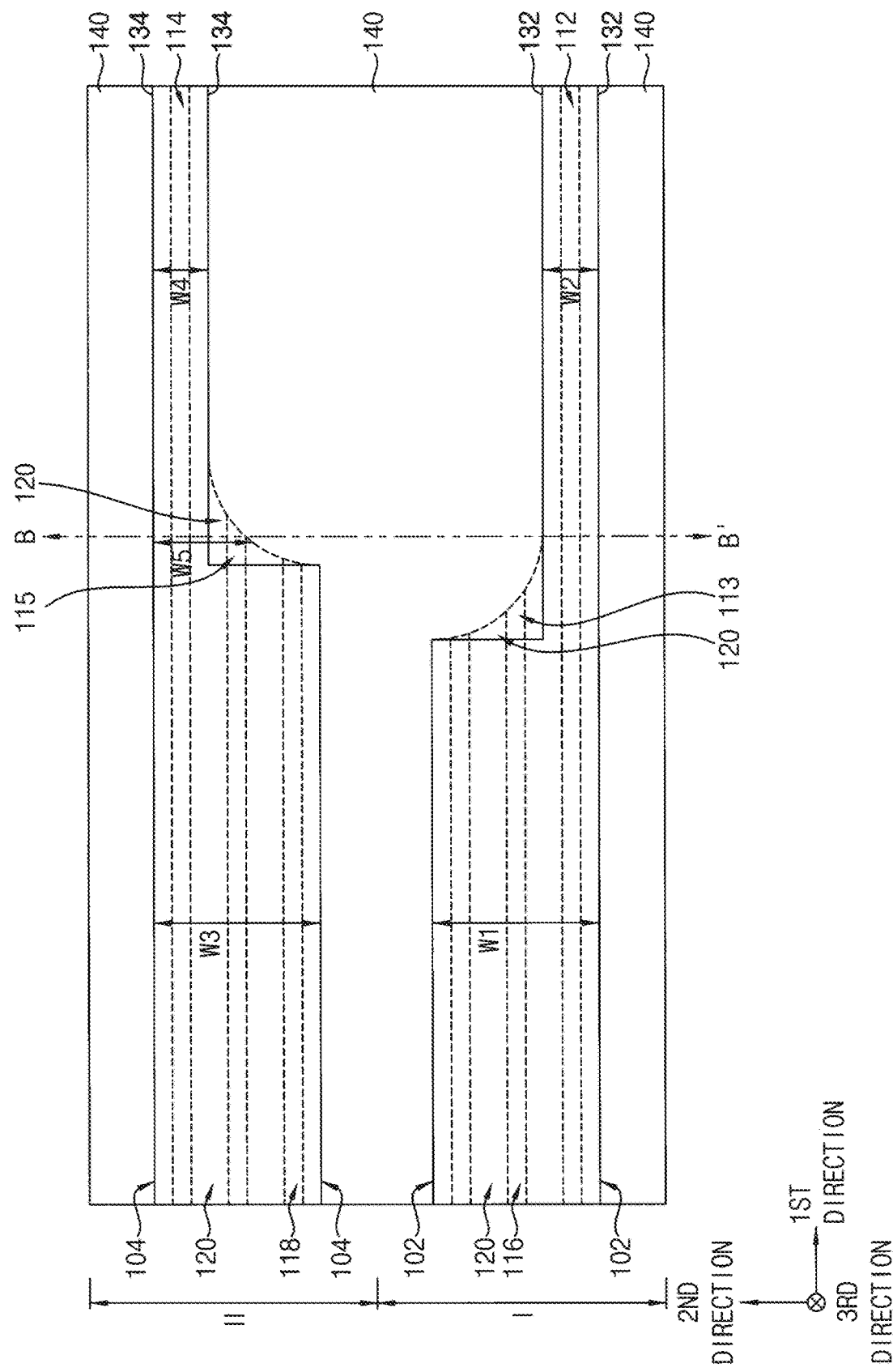
Figure 10:
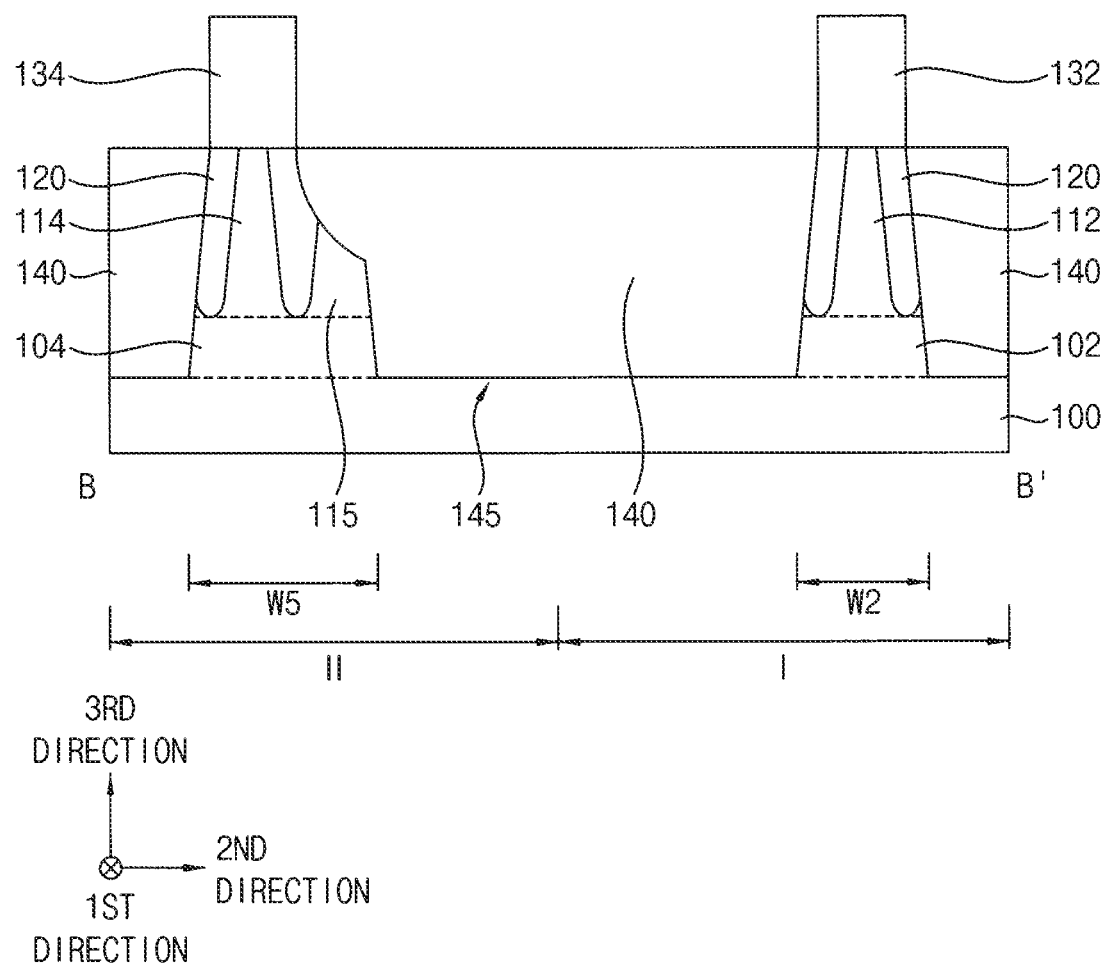

Referring to FIGS. 9 and 10, an etching process may be performed using first and second etching masks 132 and 134 exposing one or ones of the first and second active fins 112 and 114, respectively, so that the exposed one or ones of the first and second active fins 112 and 114, a portion of the first isolation pattern 120 adjacent thereto, and/or an upper portion of the substrate 100 thereunder may be partially removed to form a second recess 145. The first and second etching masks 132 and 134 may be removed, and a second isolation pattern 140 may be formed to fill the second recess 145.

In some example embodiments, a bottom of the second recess 145 may be lower than those of the first and second active fins 112 and 114, and thus first and second active regions 102 and 104 defined by the second recess 145 may be formed on the first and second regions I and II, respectively, of the substrate 100.

Hereinafter, a lower portion of the substrate 100, that is, a portion of the substrate 100 under bottoms of the first and second active regions 102 and 104 may be referred to as the substrate 100 so as to be differentiated from the first and second active regions 102 and 104. As a result, the first and second active regions 102 and 104 may be formed on the substrate 100, and the first and second active fins 112 and 114 may be formed on the first and second active regions 102 and 104, respectively.

The first and second etching masks 132 and 134 may extend in the first direction on the first and second regions I and II, respectively, of the substrate 100. In some example embodiments, the first etching mask 132 may include a first portion having a first width W1 in the second direction, and a second portion having a second width W2 less than the first width W1 in the second direction. Likewise, the second etching mask 134 may include a first portion having a third width W3 in the second direction, and a fourth width W4 less than the third width W3 in the second direction.

In some example embodiments, a first boundary between the first and second portions of the first etching mask 132 may not be aligned in the second direction with a second boundary between the first and second portions of the second etching mask 134.

In some example embodiments, when the etching process using the first and second etching masks 132 and 134 is performed, etching gas may not be efficiently provided to areas of the first and second etching masks 132 and 134 of which widths in the second direction rapidly decrease, that is, areas adjacent the first and second boundaries of the first and second etching masks 132 and 134, respectively, and thus widths of the first and second active regions 102 and 104 may not rapidly change but gently change unlike the first and second etching masks 132 and 134.

Accordingly, the first active region 102 may further include a third portion having a width decreasing from the first width W1 to the second width W2 between the first and second portions thereof, and the second active region 104 may also further include a third portion having a width decreasing from the third width W3 to the fourth width W4 between the first and second portions thereof. Hereinafter, the width of the third portion of the second active region 104 may be defined by a fifth width W5.

As the second recess 145 is formed, the ones of the first and second active fins 112 and 114 may have extension lengths in the first direction that may be shorter than those of other ones of the first and second active fins 112 and 114. Hereinafter, the one or ones of the first active fins 112 having a shorter extension length may be referred to as a third active fin 116, and the one or ones of the second active fins 114 having a shorter extension length may be referred to as a fourth active fin 118. Additionally, the first and third active fins 112 and 116 on the first active region 102 may be referred to as first group active fins, and the second and fourth active fins 114 and 118 on the second active region 104 may be referred to as second group active fins.

In some example embodiments, one or a plurality of third active fins 116 may be spaced apart from each other in the second direction, and/or one a plurality of fourth active fins 118 may be spaced apart from each other in the second direction. Additionally, one or a plurality of first active fins 112 may be spaced apart from each other in the second direction, and/or one or a plurality of second active fins 114 may be spaced apart from each other in the second direction.

As illustrated above, the first and second active regions 102 and 104 may include the third portions, and portions of the third and fourth active fins 116 and 118 remaining on the third portions may be referred to as fifth and sixth active fins 113 and 115, respectively.

The first and second etching masks 132 and 134 may be removed by, e.g., an ashing process and/or a stripping process.

The second isolation pattern 140 may be formed by forming a second isolation layer on the first to sixth active fins 112, 114, 116, 118, 113 and/or 115, the first isolation pattern 120 and/or the substrate 100 to fill the second recess 145, and planarizing the second isolation layer until upper surfaces of the first to sixth active fins 112, 114, 116, 118, 113 and/or 115 may be exposed. The second isolation pattern 140 may include an oxide, e.g., silicon oxide. In some example embodiments, the second isolation pattern 140 may include a material substantially the same as that of the first isolation pattern 120, and thus may be merged thereto. The first and second isolation patterns 120 and 140 may be referred to as an isolation structure.

Figure 11:
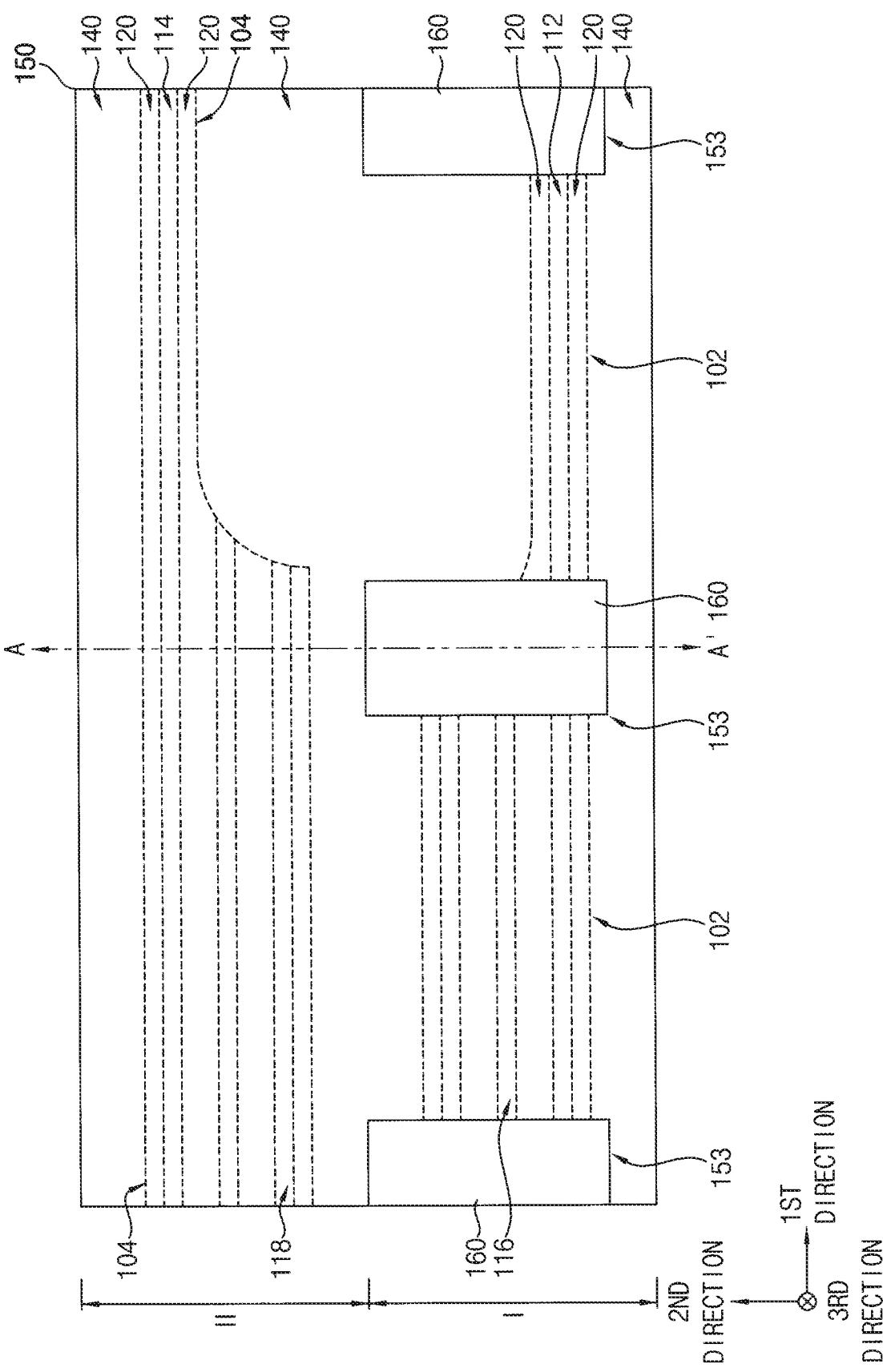

Referring to FIGS. 11 and 12, a first diffusion prevention pattern 160 may be formed through the first, third and/or fifth active fins 112, 116 and 113 on the first region I of the substrate 100.

The first diffusion prevention pattern 160 may be formed by removing the first, third and/or fifth active fins 112, 116 and 113 and/or portions of the first and/or second isolation patterns 120 and 140 adjacent thereto in the second direction through an etching process using a third etching mask 150 including a first opening 153 to form a third recess 165, removing the third etching mask 150, and/or filling the third recess 165.

In some example embodiments, the first diffusion prevention pattern 160 may extend through a central portion of the first active fin 112 in the first direction, an end of the third active fin 116 in the first direction, and/or the fifth active fin 113. The first diffusion prevention pattern 160 may have a bottom substantially coplanar with or lower than bottoms of the first, third and fifth active fins 112, 116 and 113, and thus the first active fin 112 extending in the first direction may be divided in the first direction by the first diffusion prevention pattern 160.

As the first diffusion prevention pattern 160 is formed, the fifth active fin 113 on the third portion of the first active region 102 having a changing width in the second direction may be removed, and thus the instability of the characteristics, e.g., capacitance, of the active fin due to the LLE may be reduced or prevented.

The first diffusion prevention pattern 160 may include an oxide, e.g., silicon oxide. In some example embodiments, the first diffusion prevention pattern 160 may include a material substantially the same as that of the first isolation pattern 120 and/or the second isolation pattern 140 so as to be merged thereto.

Figure 13:
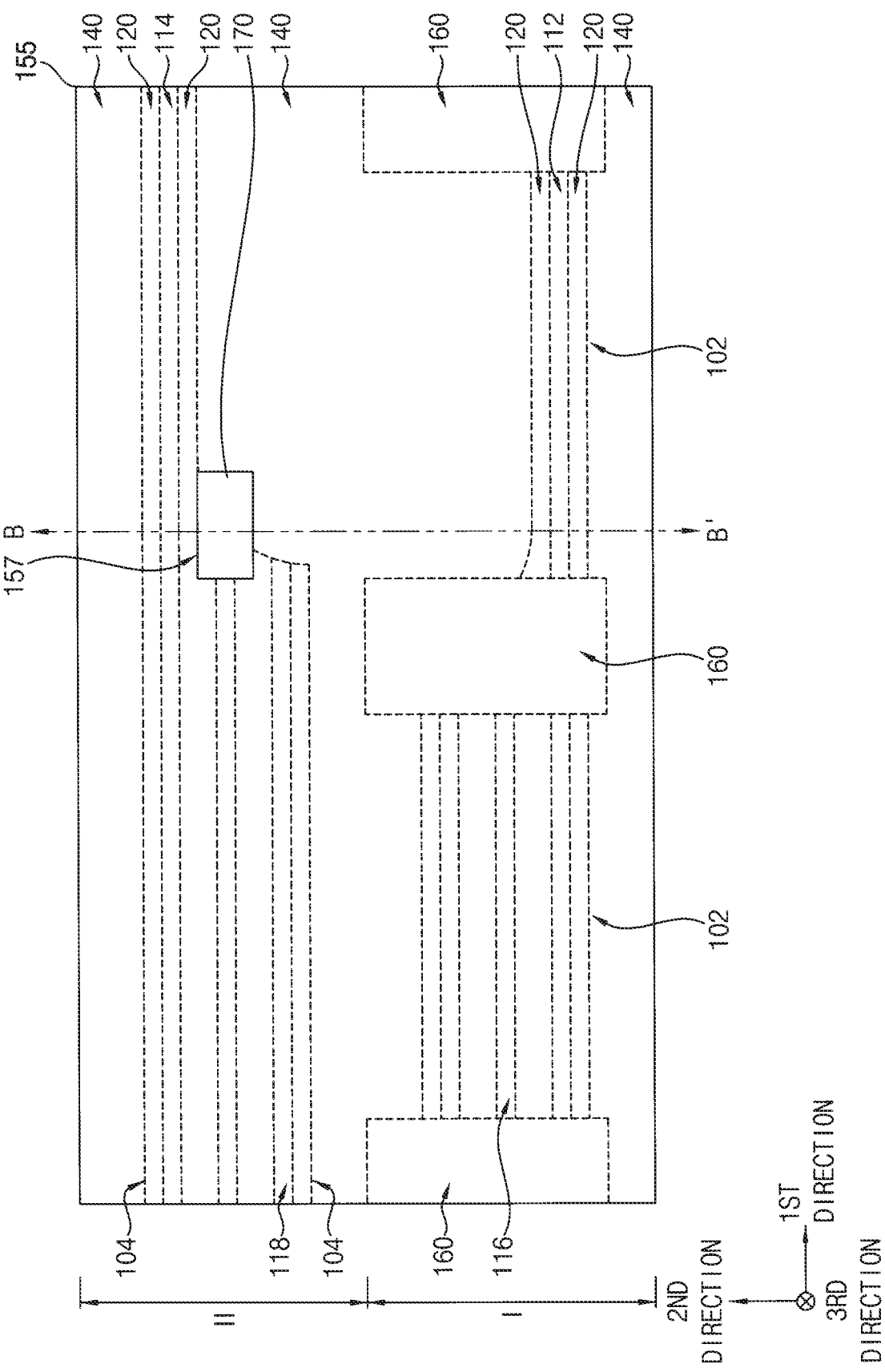
Figure 14:
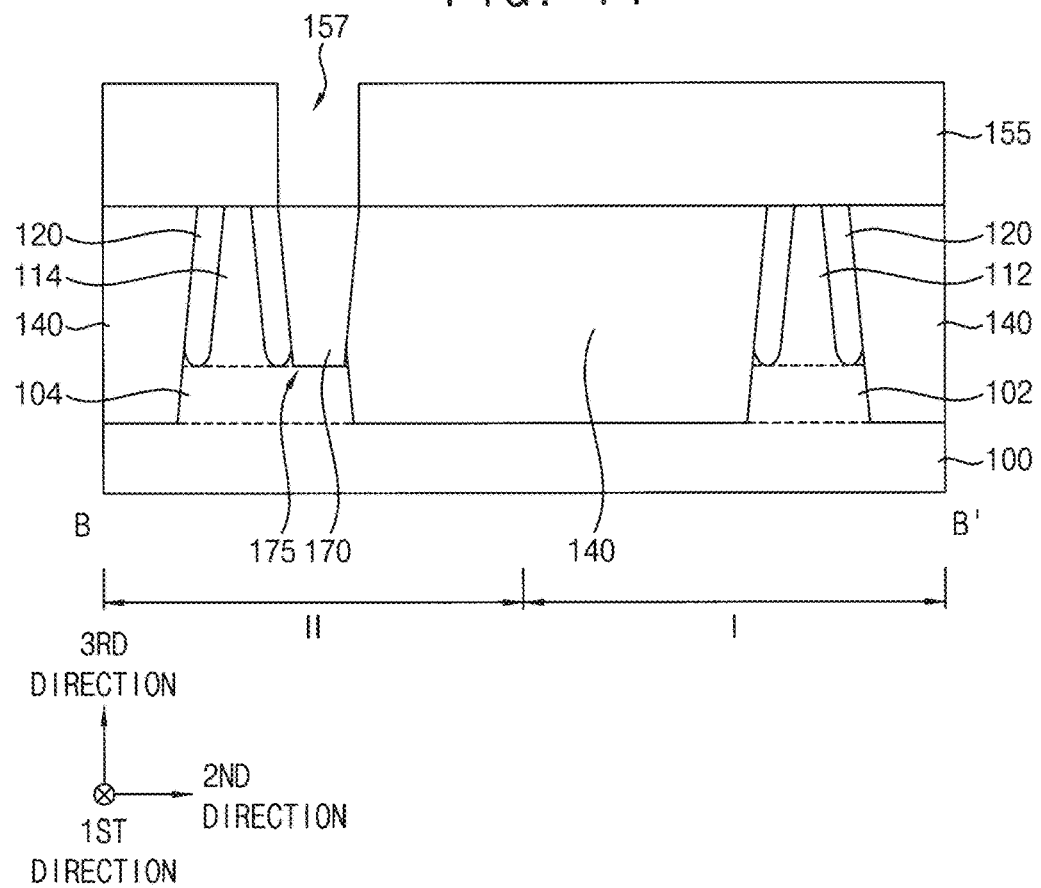

Referring to FIGS. 13 and 14, an insulation pattern 170 may be formed through the sixth active fin 115 on the second region II of the substrate 100.

The insulation pattern 170 may be formed by removing the sixth active fin 115 and/or portions of the first and/or second isolation patterns 120 and 140 adjacent thereto through an etching process using a fourth etching mask 155 including a second opening 157 to form a fourth recess 175, removing the fourth etching mask 155, and filling the fourth recess 175.

In some example embodiments, the insulation pattern 170 may have a bottom substantially coplanar with or lower than that of the sixth active fin 115, and thus the sixth active fin 115 may be removed by the fourth recess 175.

As will be illustrated with reference to FIGS. 32 and 33 later, as the insulation pattern 170 is formed, a third source/drain layer 265 may not be formed on the sixth active fin 115, and thus an electrical short between the third source/drain layer 265 and other neighboring conductive structures may be reduced or prevented.

The insulation pattern 170 may include an oxide, e.g., silicon oxide. In some example embodiments, the insulation pattern 170 may include a material substantially the same as that of the first isolation pattern 120 and/or a second isolation pattern 140 contacting the insulation pattern 170 so as to be merged thereto.

Figure 15:
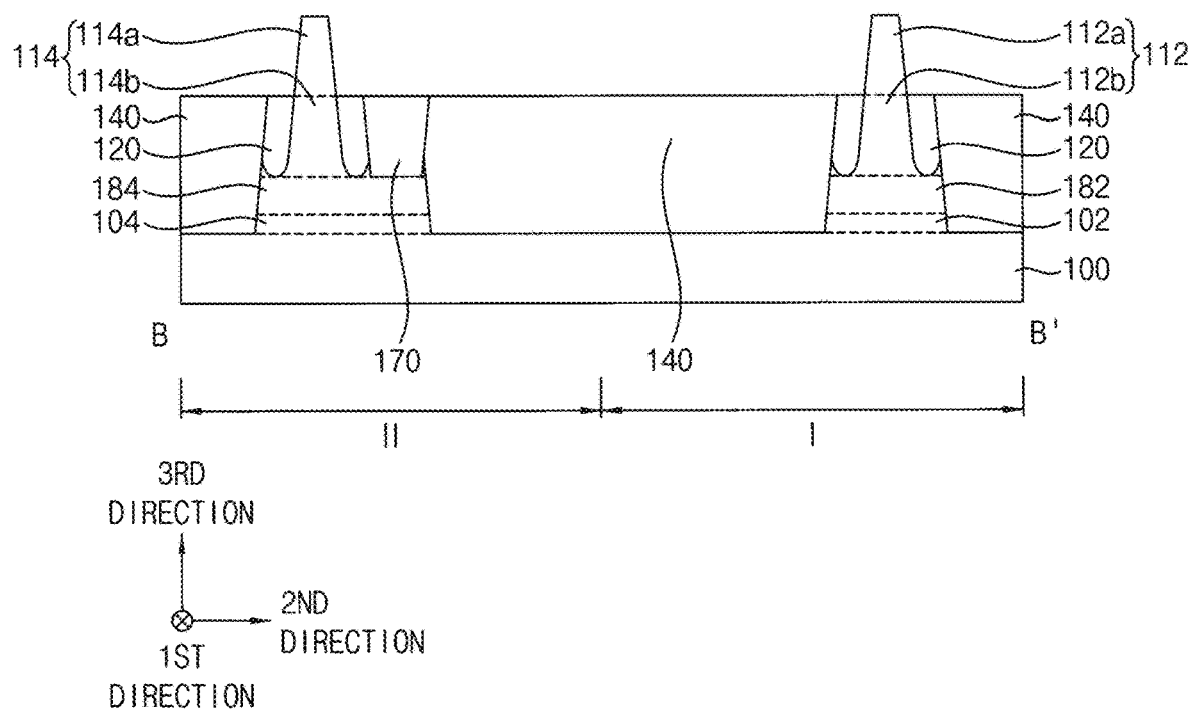
Figure 16:
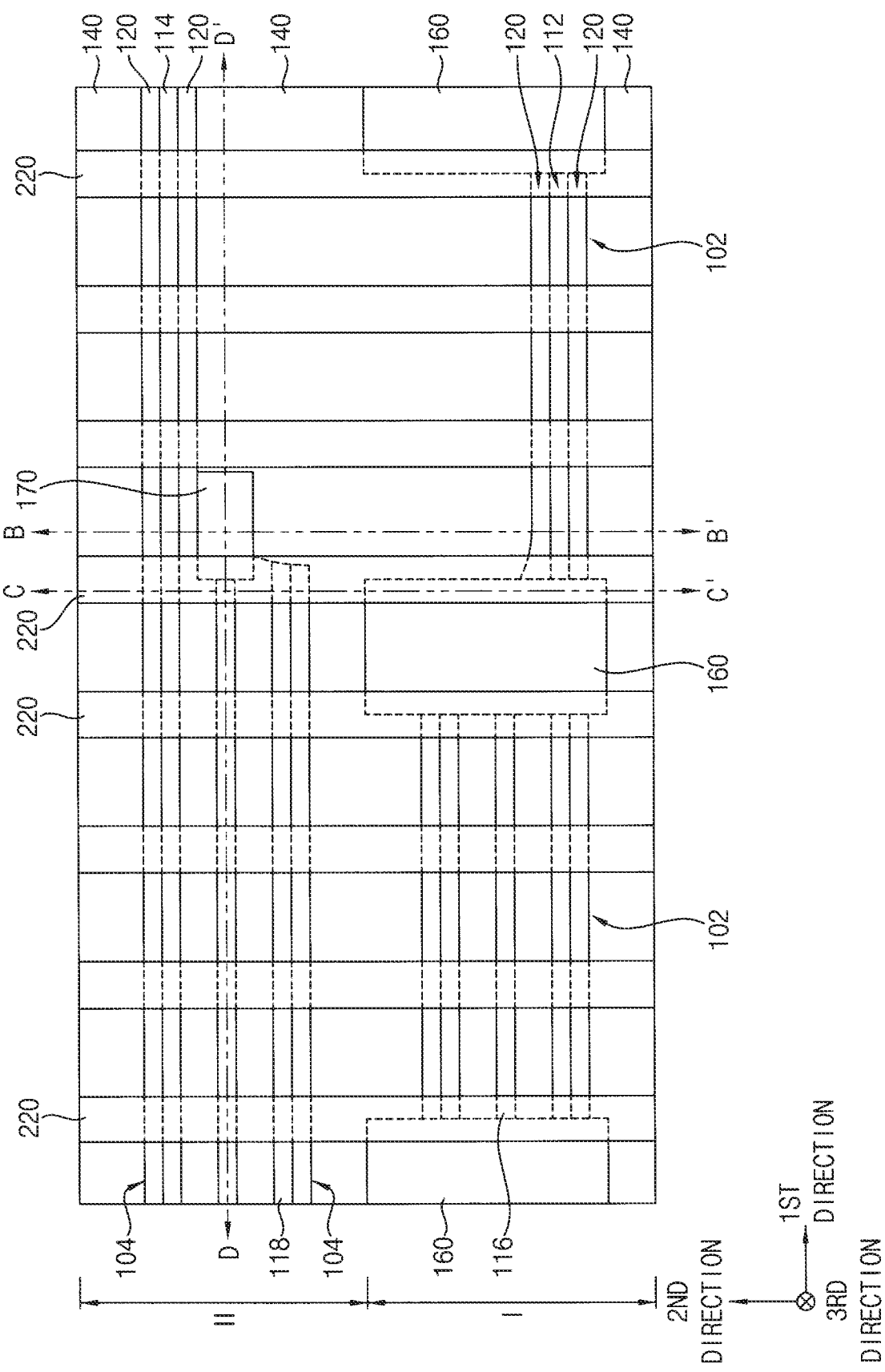

Referring to FIG. 15, upper portions of the first and second isolation patterns 120 and 140 may be removed to expose upper portions of the first to fourth active fins 112, 114, 116 and 118.

In some example embodiments, the upper portions of the first and/or second isolation patterns 120 and 140 may be removed by an etch back process, and upper portions of the first diffusion prevention pattern 160 and/or the insulation pattern 170 may be also removed.

Each of the first to fourth active fins 112, 114, 116 and 118 may include a lower active pattern of which a sidewall is covered by the first isolation pattern 120, the first diffusion prevention pattern 160 and/or the insulation pattern 170, and/or an upper active pattern protruding therefrom upwardly in the third direction. In the drawings, the first active fin 112 including a first lower active pattern 112b and a first upper active pattern 112a, the second active fin 114 including a second lower active pattern 114b and a second upper active pattern 114a, and the fourth active fin 118 including a fourth lower active pattern 118b and a fourth upper active pattern 118a (refer to FIG. 17) are shown.

First and/or second impurity regions 182 and 184 may be formed on the first and/or second regions I and II, respectively, of the substrate 100.

In some example embodiments, the first impurity region 182 may be formed at a portion of the first active region 102 under the first and/or third active fins 112 and 116, and/or the second impurity region 184 may be formed at a portion of the second active region 104 under the second and/or fourth active fins 114 and 118. The first and/or second impurity regions 182 and 184 may be formed by doping p-type and/or n-type impurities, respectively.

Referring to FIGS. 16 to 19, a dummy gate structure 220 may be formed on the substrate 100.

The dummy gate structure 220 may be formed by sequentially forming a dummy gate insulation layer, a dummy gate electrode layer, and/or a dummy gate mask layer on the first to fourth active fins 112, 114, 116 and 118, the first and/or second isolation patterns 120 and 140, the first diffusion prevention pattern 160 and/or the insulation pattern 170, etching the dummy gate mask layer using a fifth etching mask (not shown) to form a dummy gate mask 210, and/or sequentially etching the dummy gate electrode layer and the dummy gate insulation layer using the fifth etching mask as an etching mask. Thus, the dummy gate structure 220 may include a dummy gate insulation pattern 190, a dummy gate electrode 200 and/or the dummy gate mask 210 sequentially stacked.

The dummy gate insulation layer, the dummy gate electrode layer and the dummy gate mask layer may be formed by a chemical vapor deposition (CVD) process, an atomic layer deposition (ALD) process, or the like. The dummy gate insulation layer may include an oxide, e.g., silicon oxide, the dummy gate electrode layer may include, e.g., polysilicon, and/or the dummy gate mask layer may include a nitride, e.g., silicon nitride.

In some example embodiments, the dummy gate structure 220 may extend in the second direction, and a plurality of dummy gate structures 220 may be formed in the first direction.

Figure 19:
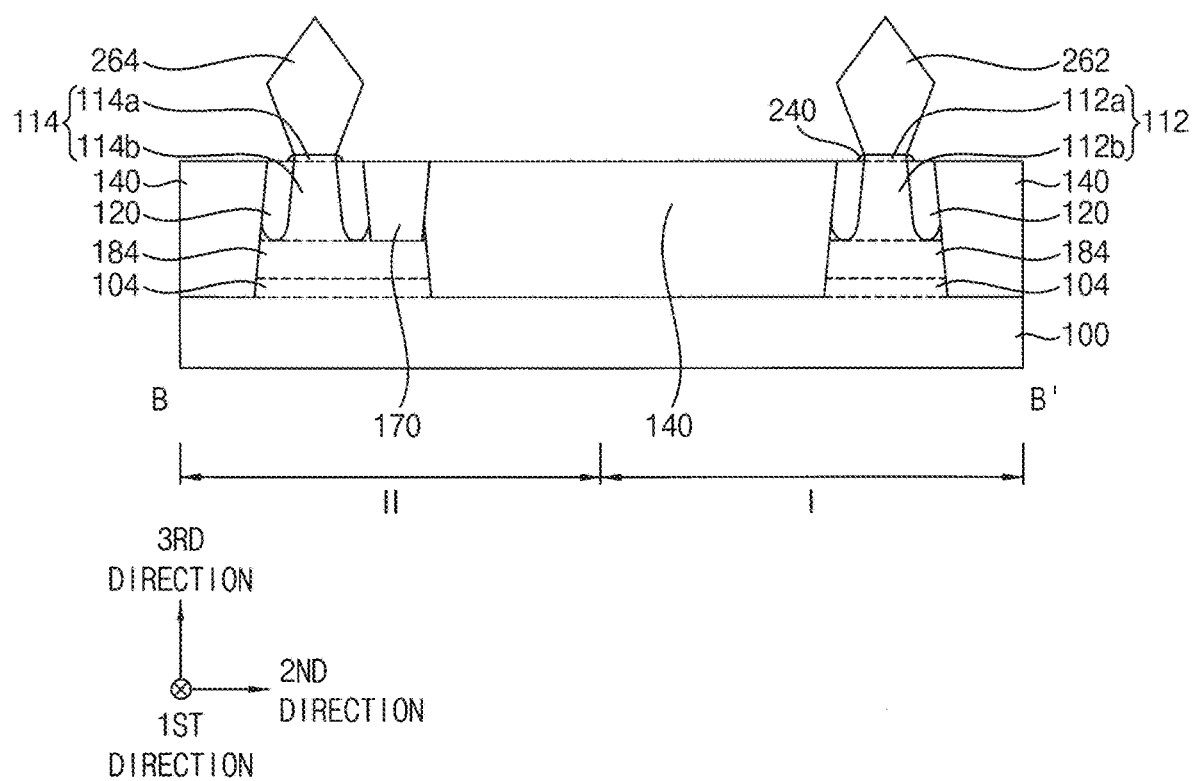
Figure 20:
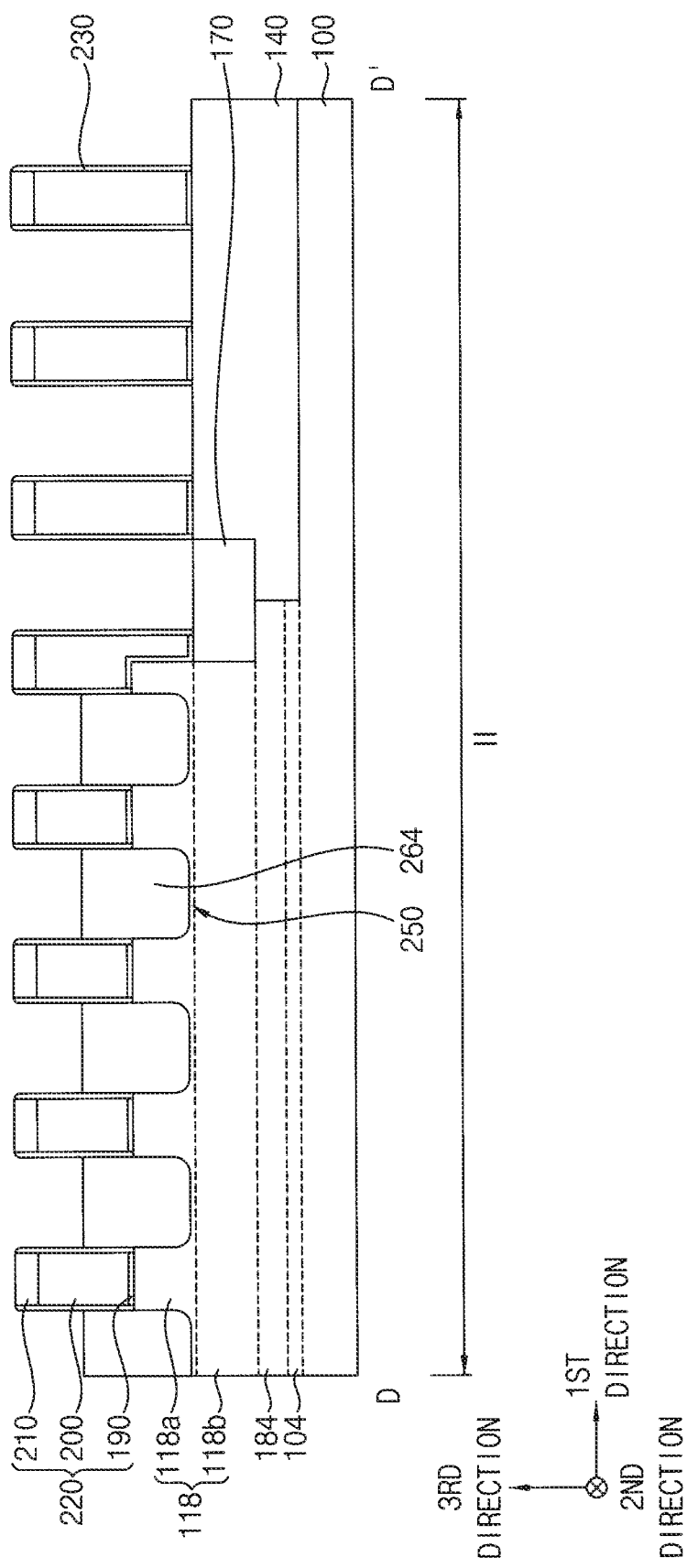

Referring to FIGS. 19 and 20, a gate spacer 230 may be formed on a sidewall of the dummy gate structure 220, and/or a fin spacer 240 may be formed on sidewalls of the first to fourth active fins 112, 114, 116 and 118.

In some example embodiments, the gate spacer 230 and/or the fin spacer 240 may be formed by forming a spacer layer on the dummy gate structures 220, the first to fourth active fins 112, 114, 116 and 118, the first and second isolation patterns 120 and 140, the first diffusion prevention pattern 160 and/or the insulation pattern 170, and anisotropically etching the spacer layer. The spacer layer may include a nitride, e.g., silicon nitride. Each of the gate spacer 230 and the fin spacer 240 may be referred to as an insulation spacer.

Upper portions of the first to fourth active fins 112, 114, 116 and 118 adjacent the dummy gate structure 220 may be etched to form a fifth recess 250, and first and second source/drain layers 262 and 264 may be formed to fill the fifth recess 250.

For example, the first to fourth active fins 112, 114, 116 and 118 may be partially removed by an etching process using the dummy gate structure 220 and the gate spacer 230 on the sidewall thereof as an etching mask to form the fifth recess 250. The fin spacer 240 may be partially or entirely removed during the etching process.

A selective epitaxial growth (SEG) process may be performed using upper surfaces of the first to fourth active fins 112, 114, 116 and 118 exposed by the fifth recess 250 to form the first and/or second source/drain layers 262 and 264.

In some example embodiments, the SEG process may be performed using a silicon source gas, e.g., disilane ($Si_2H_6$) gas and a carbon source gas, e.g., monomethylsilane ($SiH_3CH_3$) gas to form a single crystalline silicon carbide layer as the first source/drain layer 262 on the first region I of the substrate 100. Alternatively, the SEG process may be performed using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities and/or a single crystalline silicon layer doped with n-type impurities.

In some example embodiments, the SEG process may be performed using a silicon source gas, e.g., dichlorosilane ($SiH_2Cl_2$) gas, and/or a germanium source gas, e.g., germane ($GeH_4$) gas to form a single crystalline silicon-germanium layer as the second source/drain layer 264 on the second region II of the substrate 100. A p-type impurity source gas, e.g., diborane ($B_2H_6$) gas may be also used to form a single crystalline silicon-germanium layer doped with p-type impurities.

Each of the first and second source/drain layers 262 and 264 may grow both in vertical and horizontal directions, and may not only fill the fifth recess 250 but also contact a portion of the gate spacer 230. Each of the first and second source/drain layers 262 and 264 may have a cross-section taken along the second direction of which a shape may be pentagon or hexagon. When neighboring ones of the first to fourth active fins 112, 114, 116 and 118 are spaced apart from each other by a short distance, neighboring ones of the first source/drain layers 262 may be merged with each other to form a single layer, and/or neighboring ones of the second source/drain layers 264 may be merged with each other to form a single layer.

Figure 21:
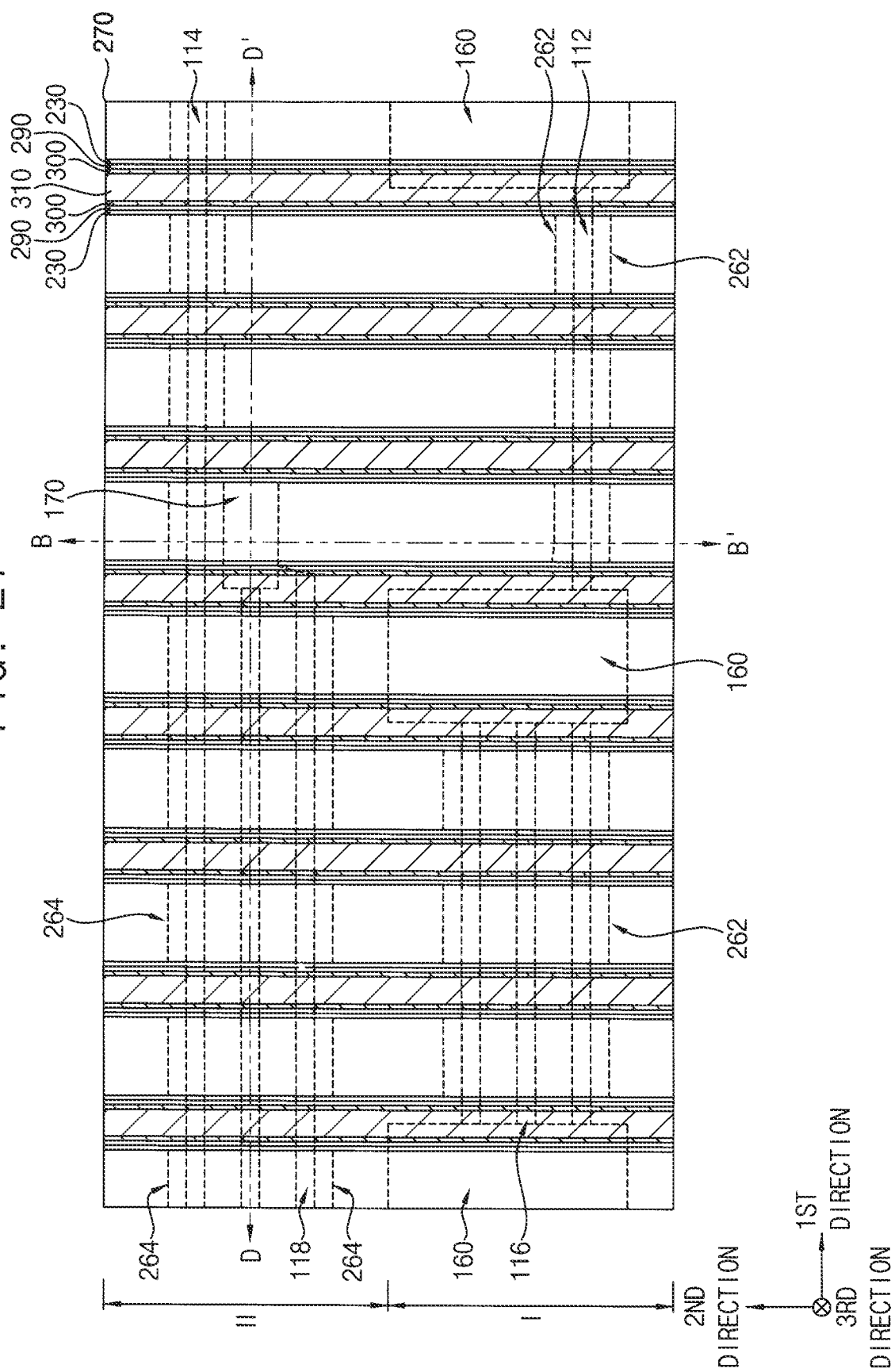
Figure 22:
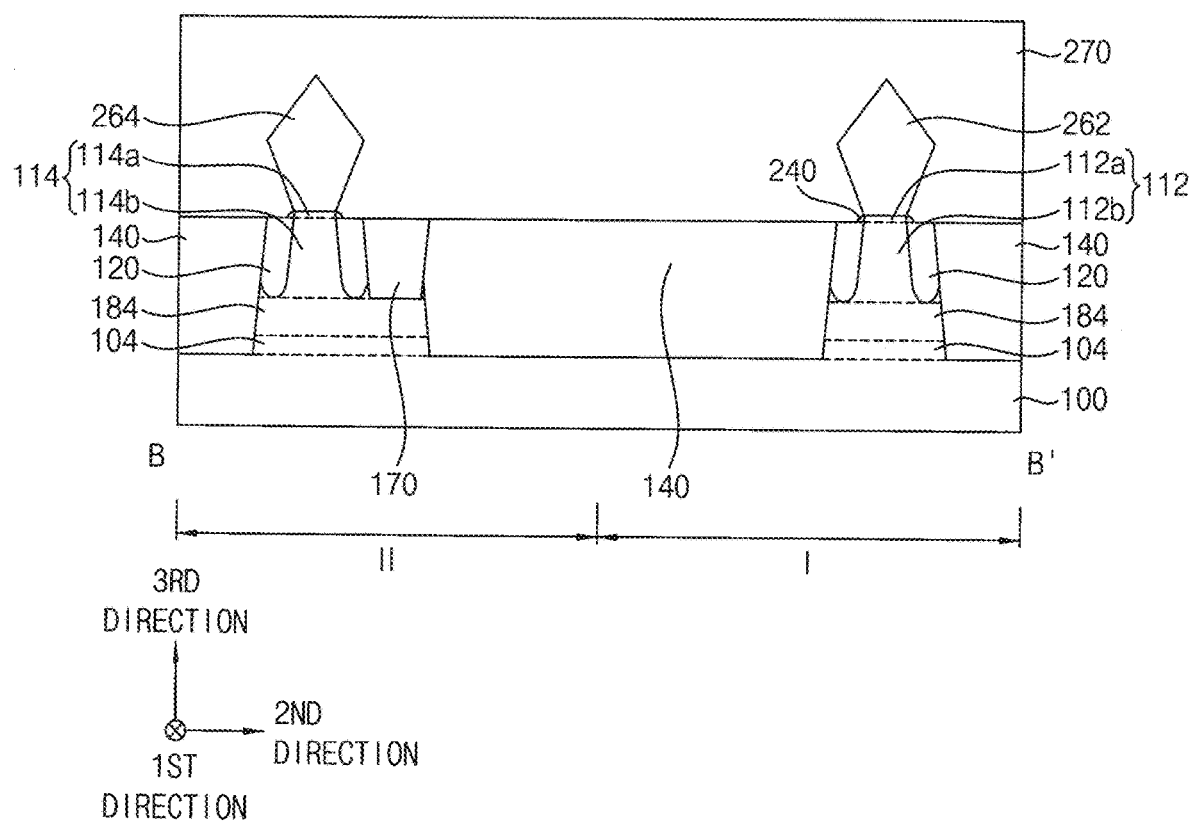
Figure 23:
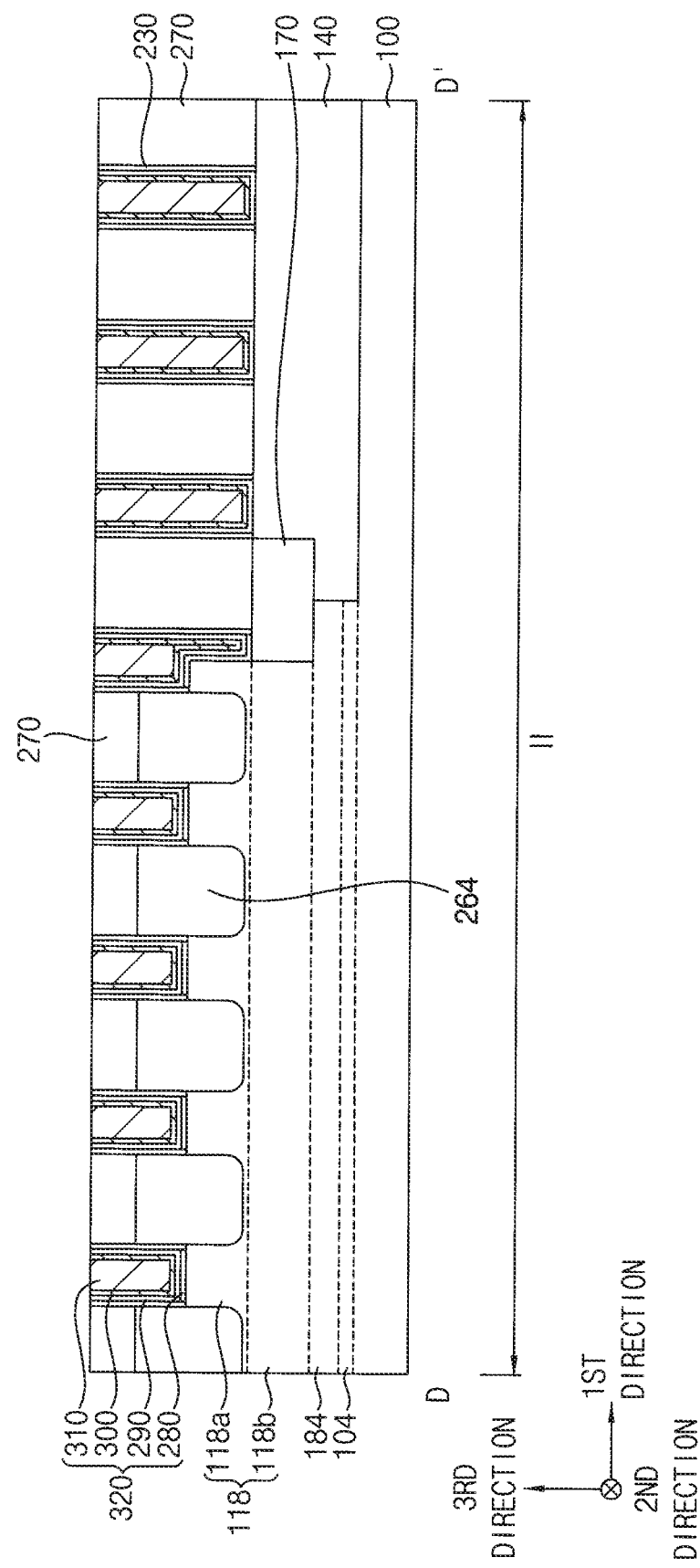

Referring to FIGS. 21 to 23, a first insulating interlayer 270 may be formed on the first to fourth active fins 112, 114, 116 and 118, the first and/or second isolation patterns 120 and 140, the first diffusion prevention pattern 160 and/or the insulation pattern 170 to cover the dummy gate structure 200, the gate spacer 230, the fin spacer 240, and/or the first and second source/drain layers 262 and 264. The first insulating interlayer 270 may be planarized until a top surface of the dummy gate electrode 200 of the dummy gate structure 200 may be exposed. The dummy gate mask 210 may also be removed, and an upper portion of the gate spacer 230 may also be removed. A space between the merged first source/drain layer 262 and the first isolation pattern 120 and/or a space between the merged second source/drain layer 264 and the first isolation pattern 120 may not be fully filled with the first insulating interlayer 270, and thus an air gap 275 (refer to FIG. 28) may be formed. The first insulating interlayer 270 may include an oxide, e.g., silicon oxide.

The exposed dummy gate electrode 200 and/or the dummy gate insulation pattern 190 thereunder may be removed to form a third opening exposing an inner sidewall of the gate spacer 230, upper surfaces of the first to fourth active fins 112, 114, 116 and 118, upper surfaces of the first and/or second isolation patterns 120 and 140, an upper surface of the first diffusion prevention pattern 160 and/or an upper surface of the insulation pattern 170. A gate structure 320 may be formed to fill the third opening.

For example, after a thermal oxidation process is performed on the upper surfaces of the first to fourth active fins 112, 114, 116 and 118 exposed by the third opening to form an interface pattern 280, a gate insulation layer and/or a workfunction control layer may be sequentially formed on the interface pattern 280, the first and second isolation patterns 120 and 140, the first diffusion prevention pattern 160, the insulation pattern 170, the gate spacer 230 and/or the first insulating interlayer 270, and/or a gate electrode layer may be formed on the workfunction control layer to sufficiently fill a remaining portion of the third opening.

The gate insulation layer, the workfunction control layer and the gate electrode layer may be formed by a CVD process or an ALD process. The interface pattern 280 may be also formed by a CVD process or an ALD process instead of the thermal oxidation process, and in this case, the interface pattern 280 may be formed not only on the upper surfaces of the first to fourth active fins 112, 114, 116 and 118 but also on the upper surfaces of the first and/or second isolation patterns 120 and 140, the upper surface of the first diffusion prevention pattern 160, the upper surface of the insulation pattern 170, and/or the inner sidewall of the gate spacer 230.

The gate electrode layer, the workfunction control layer and/or the gate insulation layer may be planarized until the upper surface of the first insulating interlayer 270 may be exposed to form a gate insulation pattern 290 and a workfunction control pattern 300 sequentially stacked on the upper surface of the interface pattern 280, the upper surfaces of the first and/or second isolation patterns 120 and 140, the upper surface of the first diffusion prevention pattern 160, the upper surface of the insulation pattern 170, and/or the inner sidewall of the gate spacer 230, and a gate electrode 310 filling a remaining portion of the third opening on the workfunction control pattern 300. Thus, a bottom and/or a sidewall of the gate electrode 310 may be covered by the workfunction control pattern 300.

The interface pattern 280, the gate insulation pattern 290, the workfunction control pattern 300 and/or the gate electrode 310 sequentially stacked may form the gate structure 320, and the gate structure 320 and/or the first and/or second source/drain layers 262 and 264 may form NMOS and/or PMOS transistors on the first and/or second regions I and II, respectively, of the substrate 100.

The interface pattern 280 may include an oxide, e.g., silicon oxide, the gate insulation pattern 290 may include a metal oxide, e.g., hafnium oxide, tantalum oxide, zirconium oxide, etc., the workfunction control pattern 300 may include a metal nitride, e.g., titanium nitride, tantalum nitride, tungsten nitride, etc., and/or the gate electrode 310 may include a metal having a low resistance, e.g., aluminum, copper, titanium, tantalum, etc., a metal nitride, and/or a metal alloy.

Figure 24:
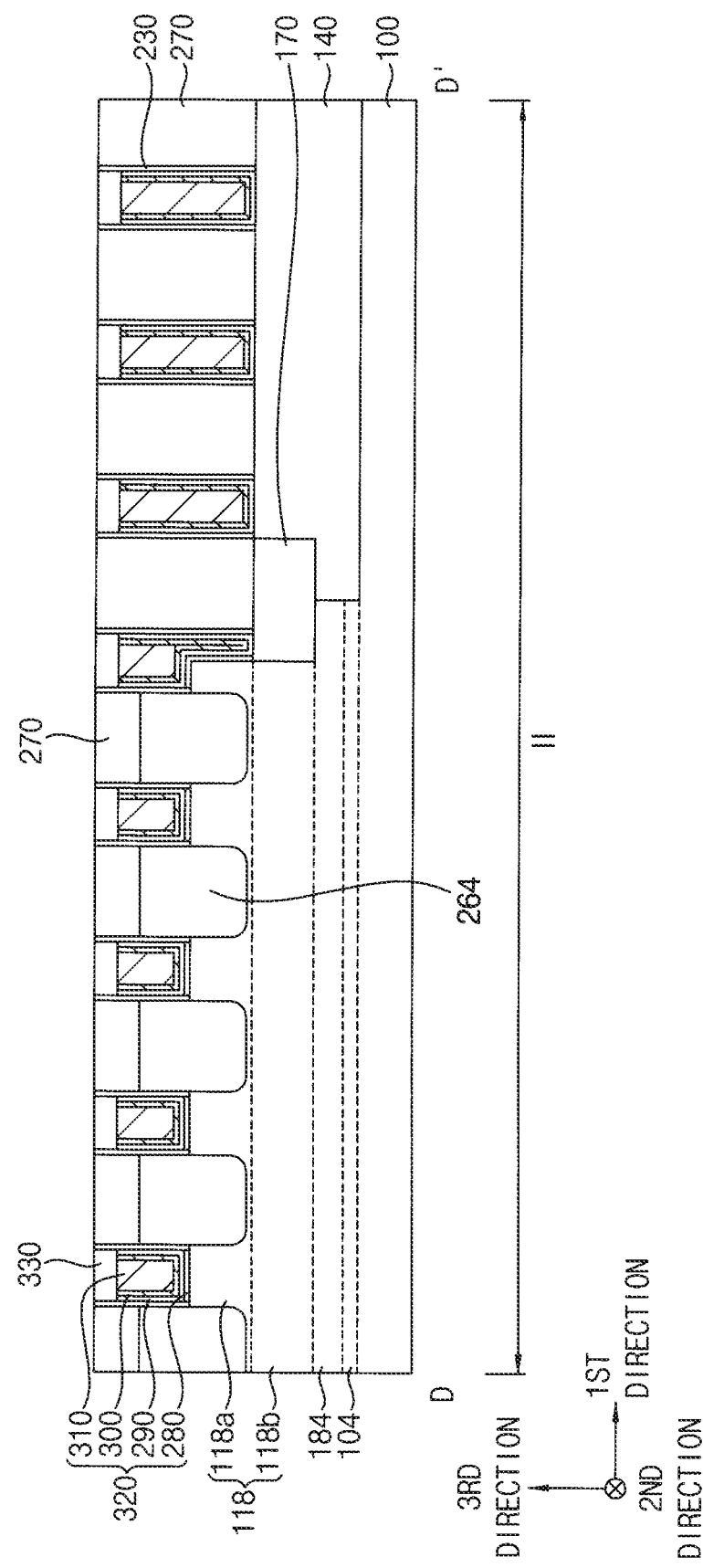

Referring to FIG. 24, an upper portion of the gate structure 320 may be removed to form a sixth recess, and a capping pattern 330 may be formed to fill the sixth recess.

The capping pattern 330 may include a nitride, e.g., silicon nitride.

Figure 25:
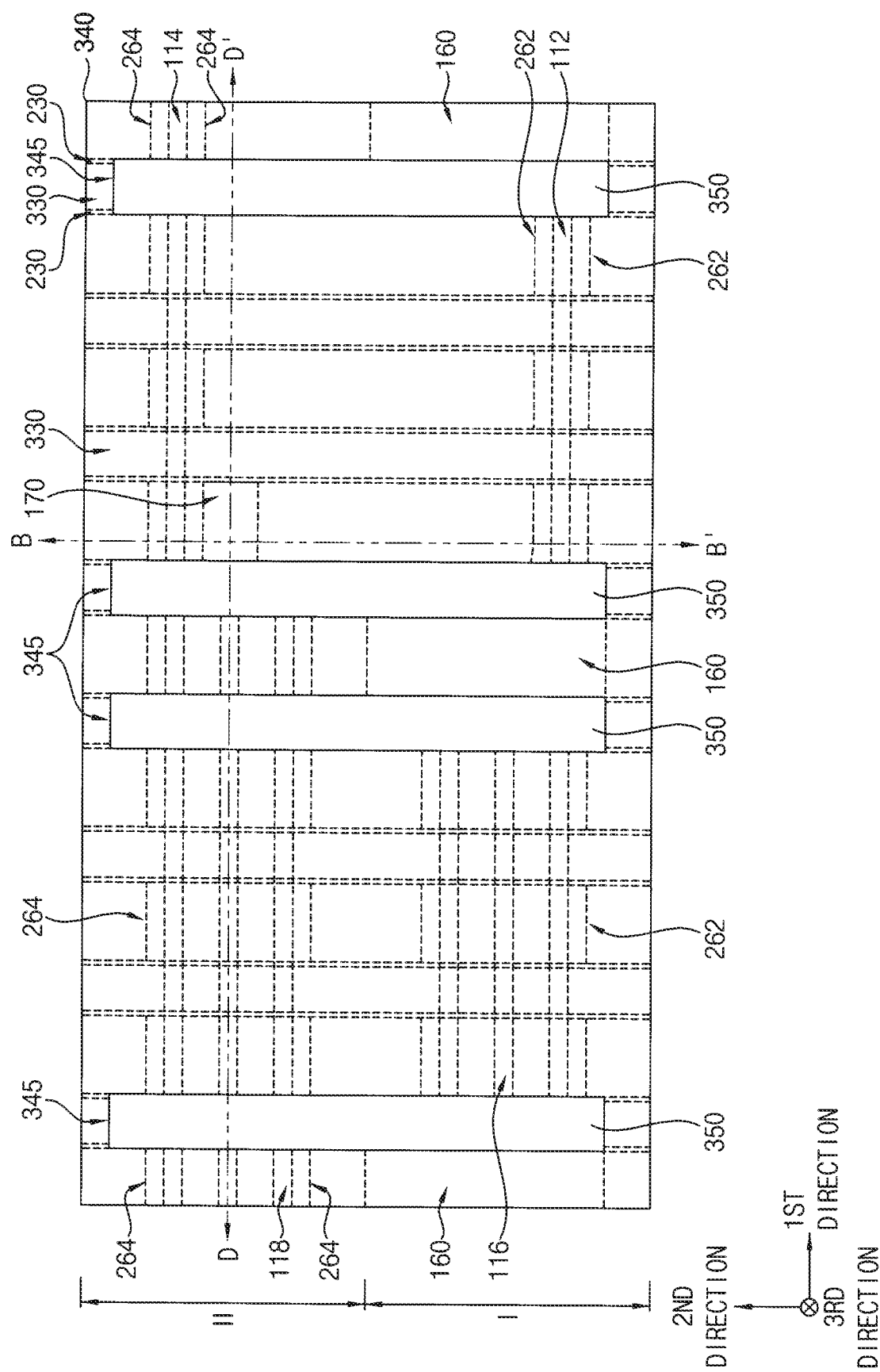
Figure 26:
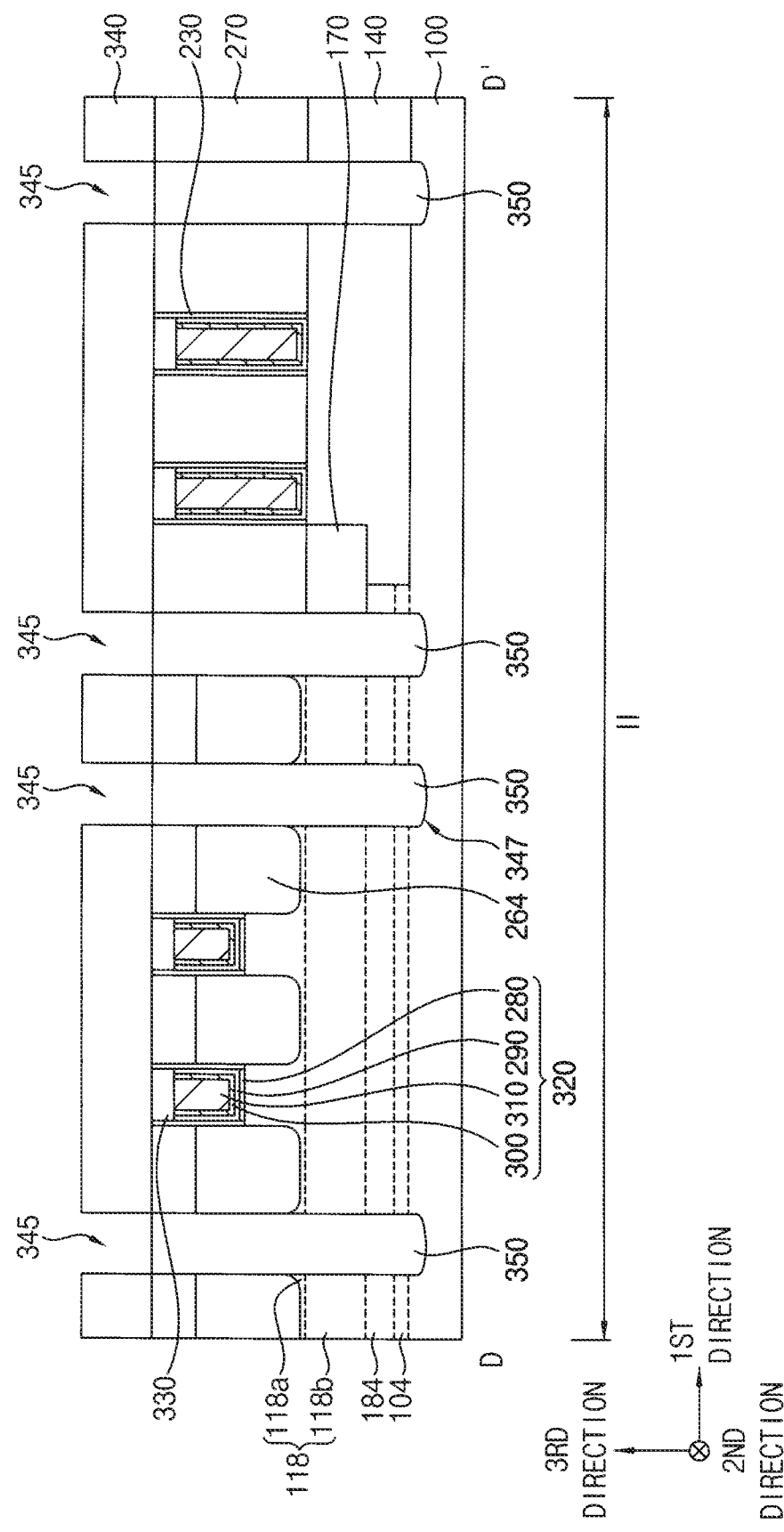
Figure 27:
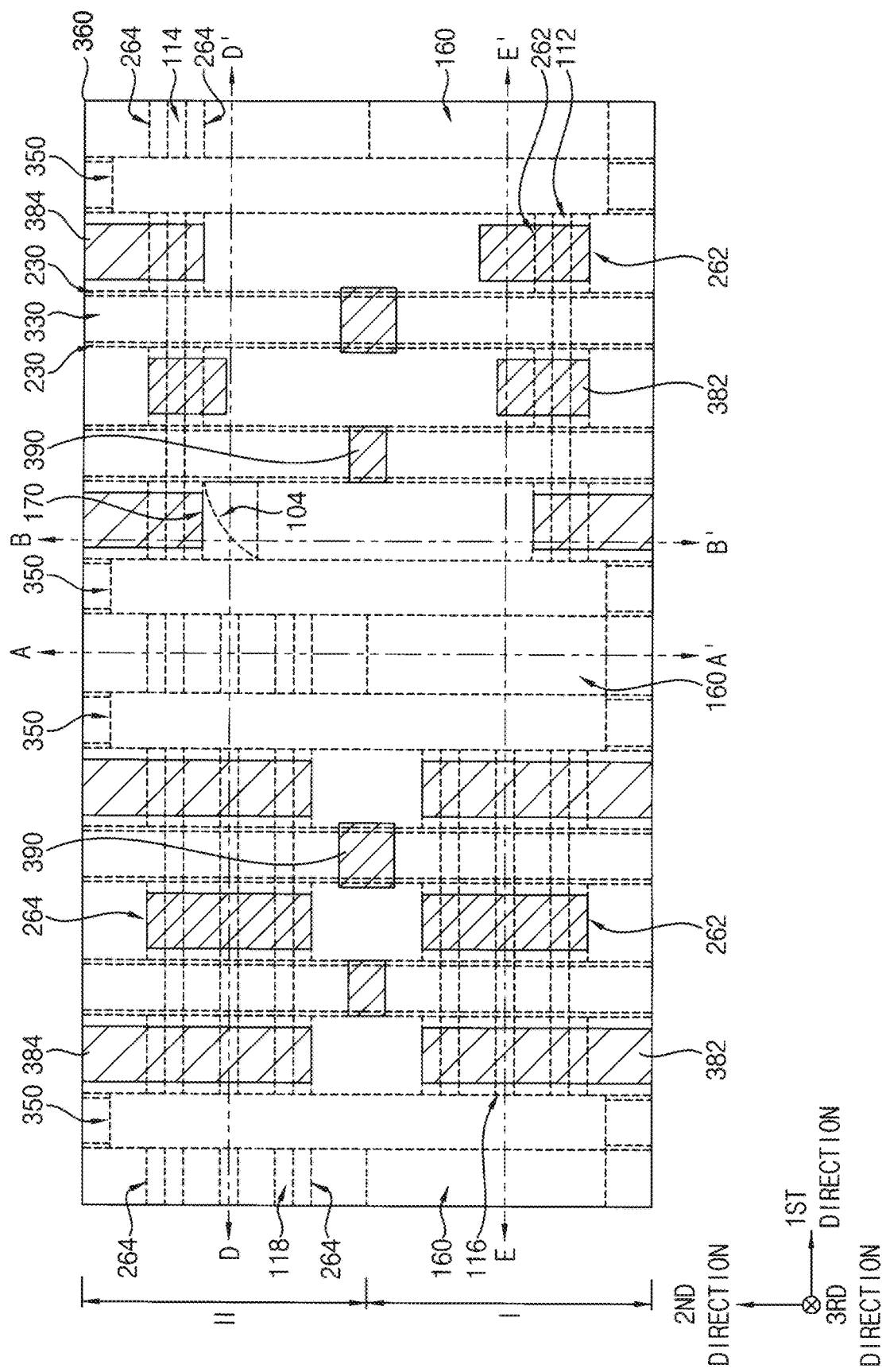

Referring to FIGS. 25 and 26, a sixth etching mask 340 including a fourth opening 345 may be formed on the capping pattern 330, the gate spacer 230 and/or the first insulating interlayer 270, and an etching process may be performed using the sixth etching mask until an upper surface of the substrate 100 may be exposed, so that the capping pattern 330, the gate structure 320, the gate spacer 230, the first to fourth active fins 112, 114, 116 and 118, the first and/or second active regions 102 and 104, the first diffusion prevention pattern 160, the insulation pattern 170, and/or the first and/or second isolation patterns 120 and 140 may be etched to form a seventh recess 347.

After removing the sixth etching mask 340, a second diffusion prevention pattern 350 may be formed to fill the seventh recess 347.

In some example embodiments, the second diffusion prevention pattern 350 may be formed by removing one of the gate structures 320 and/or a portion of the gate spacer 230 on the sidewall thereof, and thus may extend in the third direction on the first and/or second regions I and II of the substrate 100. FIGS. 25 and 26 show that the second diffusion prevention pattern 350 is formed by removing one of the gate structures 320 at an edge of each of the cells neighboring in the first direction.

Additionally, the second diffusion prevention pattern 350 may extend in the third direction through the first and/or second active regions 102 and 104 and/or the first to fourth active fins 112, 114, 116 and 118. For example, one of the second diffusion prevention patterns 350 neighboring in the first direction may extend through a central portion of the second active fin 114 in the first direction so as to divide the second active fin 114 in the first direction, may extend through and contact an end of the fourth active fin 118 in the first direction, and may extend through the first diffusion prevention pattern 160 and the insulation pattern 170 to contact a sidewall of the first diffusion prevention pattern 160 and a sidewall of the insulation pattern 170. Another one of the second diffusion prevention patterns 350 may extend through a central portion of each of the second and/or fourth active fins 114 and 118 in the first direction to divide each of the second and/or fourth active fins 114 and 118 in the first direction, and/or may extend through the first diffusion prevention pattern 160 to contact another sidewall of the first diffusion prevention pattern 160.

As the second diffusion prevention pattern 350 is formed, a portion of the sixth active fin 115 on the third portion of the second active region 104 having the changing width in the second direction may be removed, and thus the instability of the characteristics, e.g., capacitance of the active fin due to the LLE may be reduced or prevented.

The second diffusion prevention pattern 350 may be formed by removing not only a portion of the gate structure 320 on the second region II of the substrate 100 but also a portion of the gate structure 320 on the first region I of the substrate 100, and thus a leakage current due to the gate structure 320, which may be formed on the first diffusion prevention pattern 160 to serve only as a dummy gate structure, may be reduced or prevented.

The second diffusion prevention pattern 350 may include a nitride, e.g., silicon nitride.

Referring to FIGS. 27 to 31, a second insulating interlayer 360 may be formed on the first insulating interlayer 270 and/or the second diffusion prevention pattern 350, fifth and/or sixth openings may be formed through the first and/or second insulating interlayers 270 and 360 to expose upper surfaces of the first and/or second source/drain layers 262 and 264, and forming first and second metal silicide patterns 372 and 374 on the exposed upper surfaces of the first and/or second source/drain layers 262 and 264, respectively. The second insulating interlayer 360 may include an oxide, e.g., silicon oxide.

The first and/or second metal silicide patterns 372 and 374 may be formed by forming a metal layer on bottoms and sidewalls of the fifth and/or sixth openings and/or an upper surface of the second insulating interlayer 360, performing a heat treatment on the metal layer so that the metal layer and the exposed first source/drain layers 262 and 264 may be reacted with each other, and/or removing an unreacted portion of the metal layer. The metal layer may include, e.g., cobalt, nickel, titanium, etc., and thus the first and/or second metal silicide patterns 372 and 374 may include, e.g., cobalt silicide, nickel silicide, titanium silicide, etc.

A seventh opening may be formed through the second insulating interlayer 360 and/or the capping pattern 330 to expose an upper surface of the gate structure 320, and/or first to third contact plugs 382, 384 and 390 may be formed to fill the fifth to seventh openings, respectively.

Each of the first to third contact plugs 382, 384 and 390 may include a conductive pattern (not shown) and a barrier pattern (not shown) covering a bottom and/or a sidewall of the conductive pattern. For example, the conductive pattern may include a metal, and/or the barrier pattern may include a metal nitride.

Vias (not shown) and/or upper wirings (not shown) may be further formed to be connected to the first to third contact plugs 382, 384 and 390 to complete the fabrication of the semiconductor device.

In the semiconductor device manufactured by the above processes, the first diffusion prevention pattern 160 may be formed at an area at which the first active region 102 may have a varying width on the first region I of the substrate 100, and the second diffusion prevention pattern 350 and the insulation pattern 170 may be formed at an area at which the second active region 104 may have a varying width on the second region II of the substrate 100. Thus, the instability of the characteristics, e.g., capacitance of the active fin due to the LLE may be reduced or prevented.

For example, the sixth active fin 115 remaining on the area at which the second active region 104 may have the varying width may be removed and replaced by the insulation pattern 170, and thus occurrences of an electrical short with neighboring conductive structures may be reduced or prevented.

The second diffusion prevention pattern 350 may extend not only in the first region I of the substrate 100 but also in the second region II of the substrate 100, and thus a leakage current due to the dummy gate structure may be reduced or prevented.

The semiconductor device may include the following structural characteristics.

The semiconductor device may include the first group active fins including the first and/or third active fins 112 and 116 on the first region I of the substrate 100 including the first and/or second regions I and II, and/or the first diffusion prevention pattern 160 extending in the second direction through the first group active fins. The first diffusion prevention pattern 160 may extend through the central portion of the first active fin 112 in the first direction to divide the first active fin 112, and/or may extend through the end of the third active fin 116 in the first direction.

The semiconductor device may include the second group active fins including the second and/or fourth active fins 114 and 118 on the second region II of the substrate 100, and/or the second diffusion prevention pattern 350 extending in the second direction through the second group active fins. The second diffusion prevention pattern 350 may extend through the central portion of the second active fin 114 in the first direction to divide the second active fin 114, and/or may extend through and contact the end of the fourth active fin 118 in the first direction.

In some example embodiments, the second diffusion prevention pattern 350 may extend in the second direction from the first region I to the second region II of the substrate 100 to contact a sidewall of the first diffusion prevention pattern 160.

In some example embodiments, two second diffusion prevention patterns 350 may be spaced apart from each other in the first direction. One of the second diffusion prevention patterns 350 may extend through the central portion of the second active fin 114 in the first direction to divide the second active fin 114, and/or may extend through and/or contact the end of the fourth active fin 118 in the first direction on the second region II of the substrate 100. Additionally, the one of the second diffusion prevention patterns 350 may contact a sidewall of the first diffusion prevention pattern 160 on the first region I of the substrate 100. The other one of the second diffusion prevention patterns 350 may extend through the central portion of each of the second and fourth active fins 114 and 118 in the first direction to divide each of the second and fourth active fins 114 and 118 on the second region II of the substrate 100. Additionally, the other one of the second diffusion prevention patterns 350 may extend through the central portion of the first active fin 112 in the first direction to divide the first active fin 112, and/or may extend through the end of the third active fin 116 in the first direction to contact another sidewall of the first diffusion prevention pattern 160 on the first region I of the substrate 100.

In some example embodiments, the second group active fins may include a plurality of fourth active fins 118 spaced apart from each other in the second direction. The insulation pattern 170 may be formed at an opposite side to one of the fourth active fins 118 adjacent the second active fin 114 with respect to the second diffusion prevention pattern 350.

In some example embodiments, the second active region 104 on the second region II of the substrate 100 may protrude from the substrate 100 upwardly to extend in the first direction, and/or may include the first portion having the third width W3, the second portion having the fourth width W4 less than the third width W3, and/or the third portion between the first and second portions having the fifth width W5 less than the third width W3 but more than the fourth width W4.

The second active fin 114 may extend in the first direction to a first length on the first to third portions of the second active region 104, and/or the fourth active fin 118 may be spaced apart from the second active fin 114 in the second direction on the first portion of the second active region 104 and/or may extend in the first direction to a second length less than the first length. In some example embodiments, a distance from a sidewall of the third portion of the second active region 104 to the second active fin 114 may be greater than a distance from a sidewall of each of the first and second portions of the second active region 104 to the second active fin 114.

In some example embodiments, the insulation pattern 170 may be formed on the third portion of the second active region 104 to be spaced apart from the second active fin 114 in the second direction.

Figure 32:
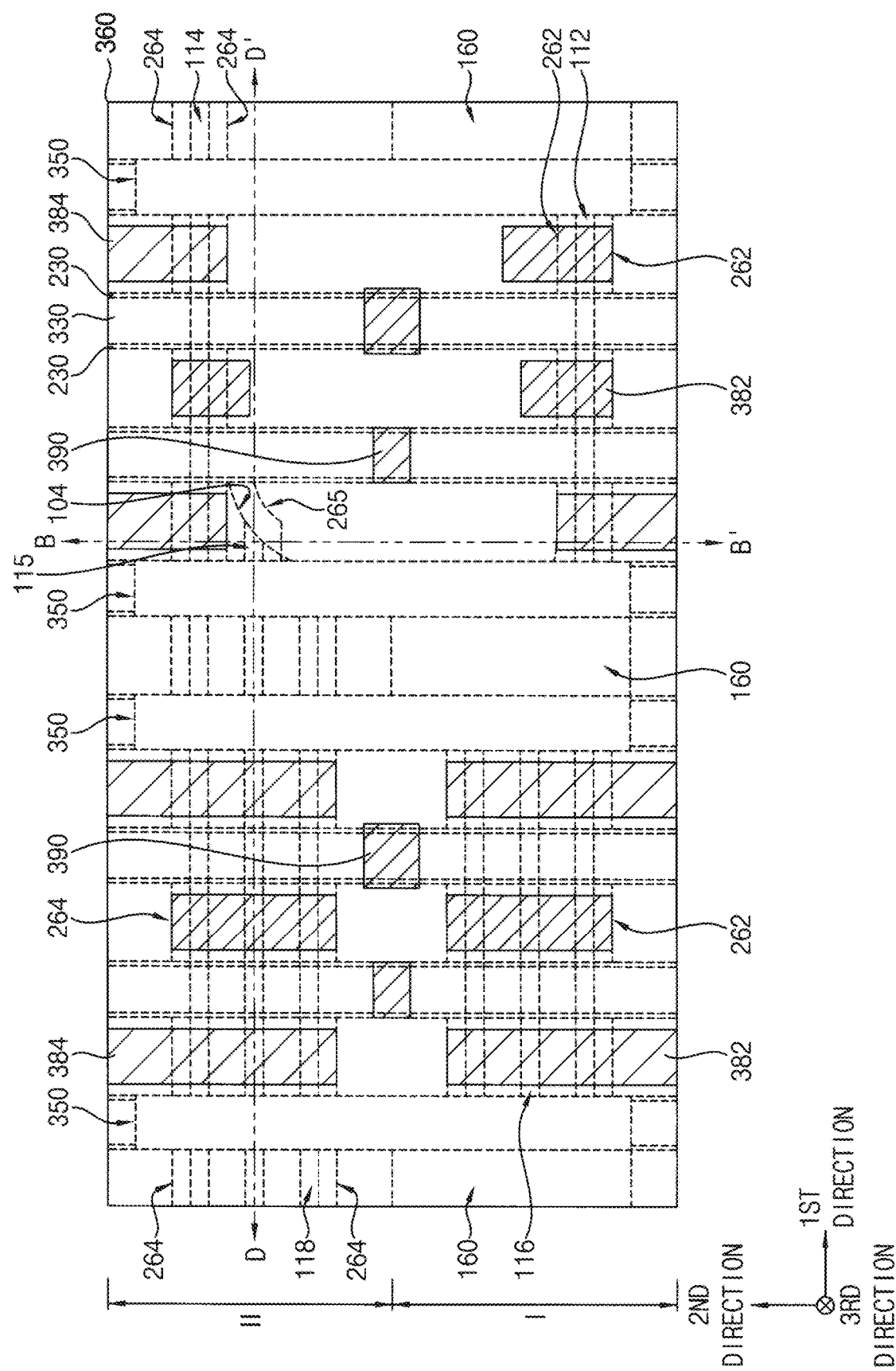
FIGS. 32 and 33 are a plan view and a cross-sectional view illustrating a semiconductor device in accordance with First Comparative Embodiment.
Figure 33:
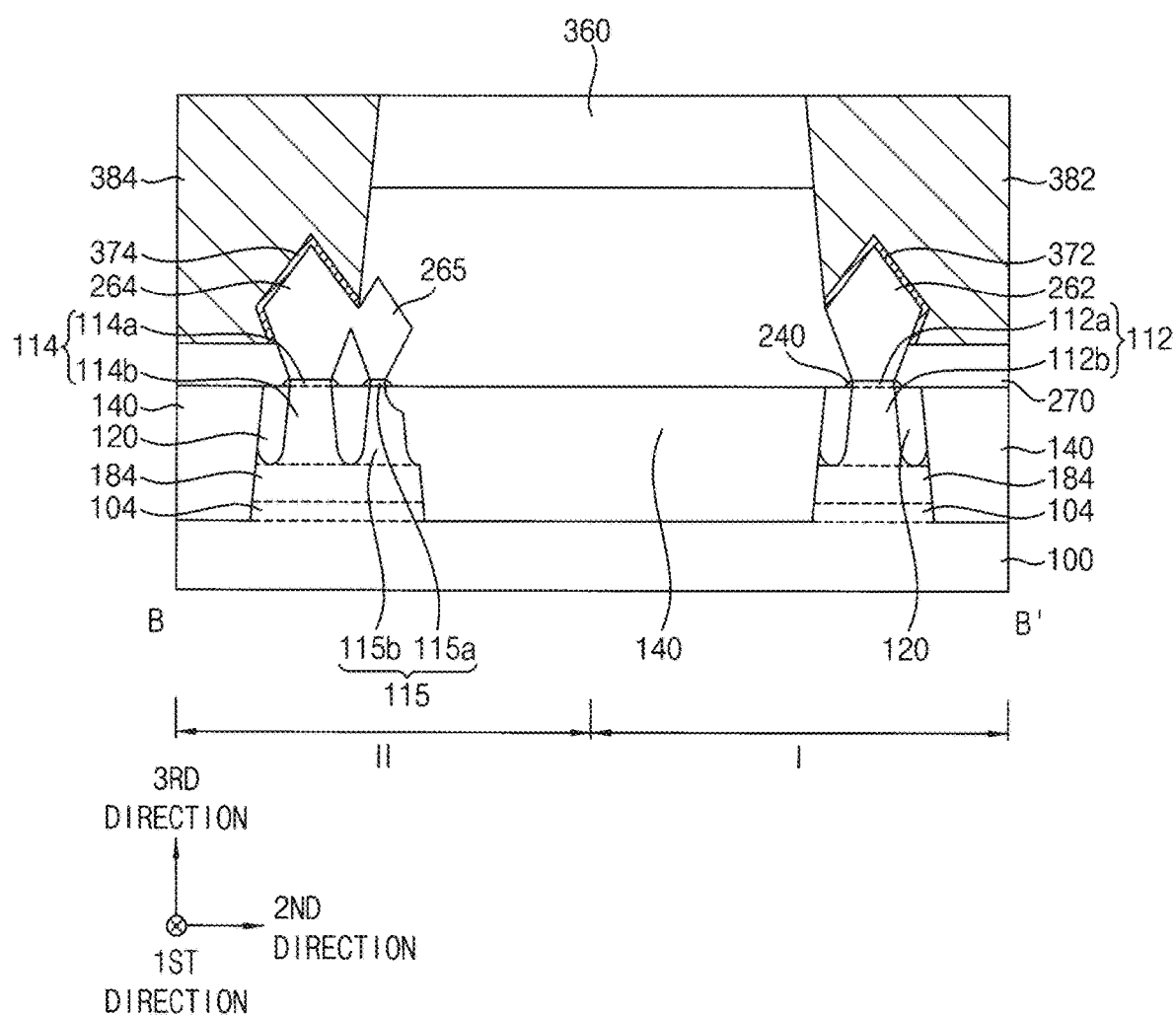

FIGS. 32 and 33 are a plan view and a cross-sectional view illustrating a semiconductor device in accordance with First Comparative Embodiment. Particularly, FIG. 32 is a plan view, and FIG. 33 is a cross-sectional view taken along a line B-B' of FIG. 32.

This semiconductor device may be substantially the same as or similar to that of FIGS. 27 to 31 except for the insulation pattern. Thus, like reference numerals refer to like elements, and detailed descriptions thereon are omitted herein.

Referring to FIGS. 32 and 33, the semiconductor device may not include the insulation pattern 170, and thus the sixth active fin 115 including sixth lower and upper active patterns 115b and 115a on the third portion of the second active region 104 having a varying width may not be removed.

Accordingly, the third source/drain layer 265 may be formed on the sixth active fin 115, which may be connected to the second source/drain layer 264, and thus an electrical short with the second contact plug 384 on the second source/drain layer 264 may occur.

Figure 34:
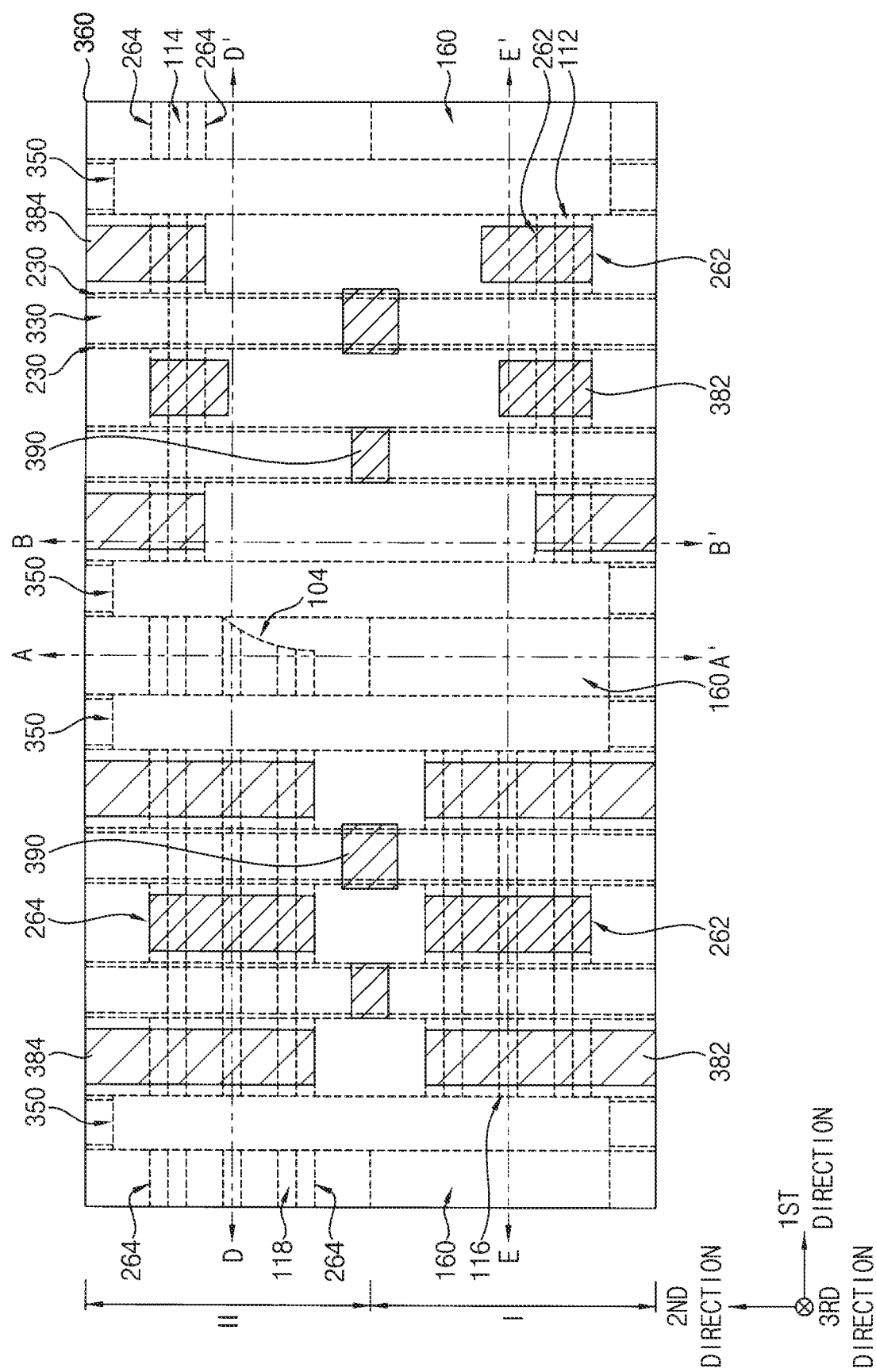
FIG. 34 is a plan view illustrating a semiconductor device in accordance with Second Comparative Embodiment.

FIG. 34 is a plan view illustrating a semiconductor device in accordance with Second Comparative Embodiment.

This semiconductor device may be substantially the same as or similar to that of FIGS. 27 to 31 except for the location of the third portion of the second active region 104.

Referring to FIG. 34, the third portion of the second active region 104 may be formed between the second diffusion prevention patterns 350.

Thus, extension lengths of the fourth active fins 118 in the first direction on the second active region 104 may not be the same but different from each other, and the characteristics, e.g., capacitance of the fourth active fins 118 may not be stable.

Figure 35:
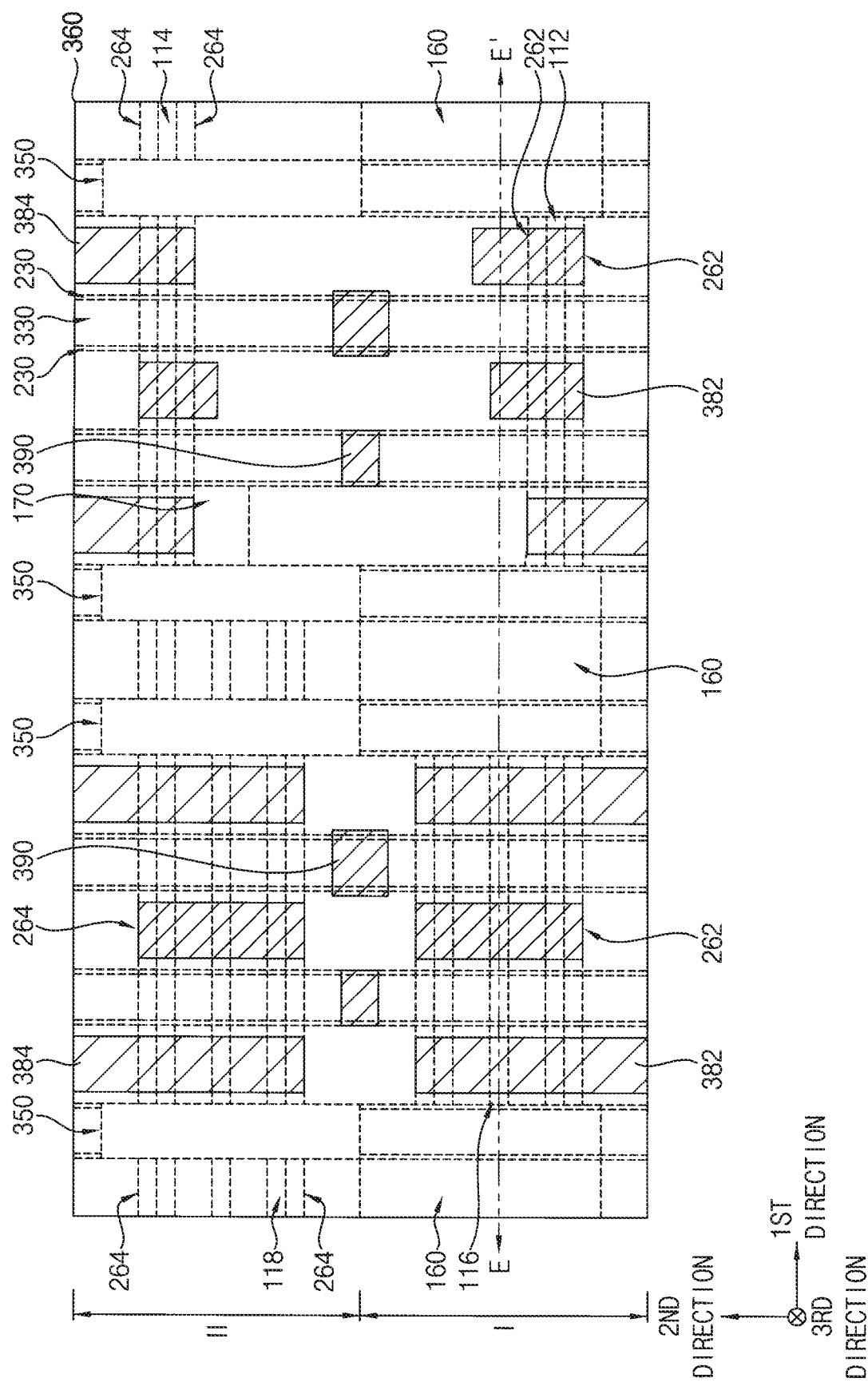
FIGS. 35 and 36 are a plan view and a cross-sectional view illustrating a semiconductor device in accordance with Third Comparative Embodiment.
Figure 36:
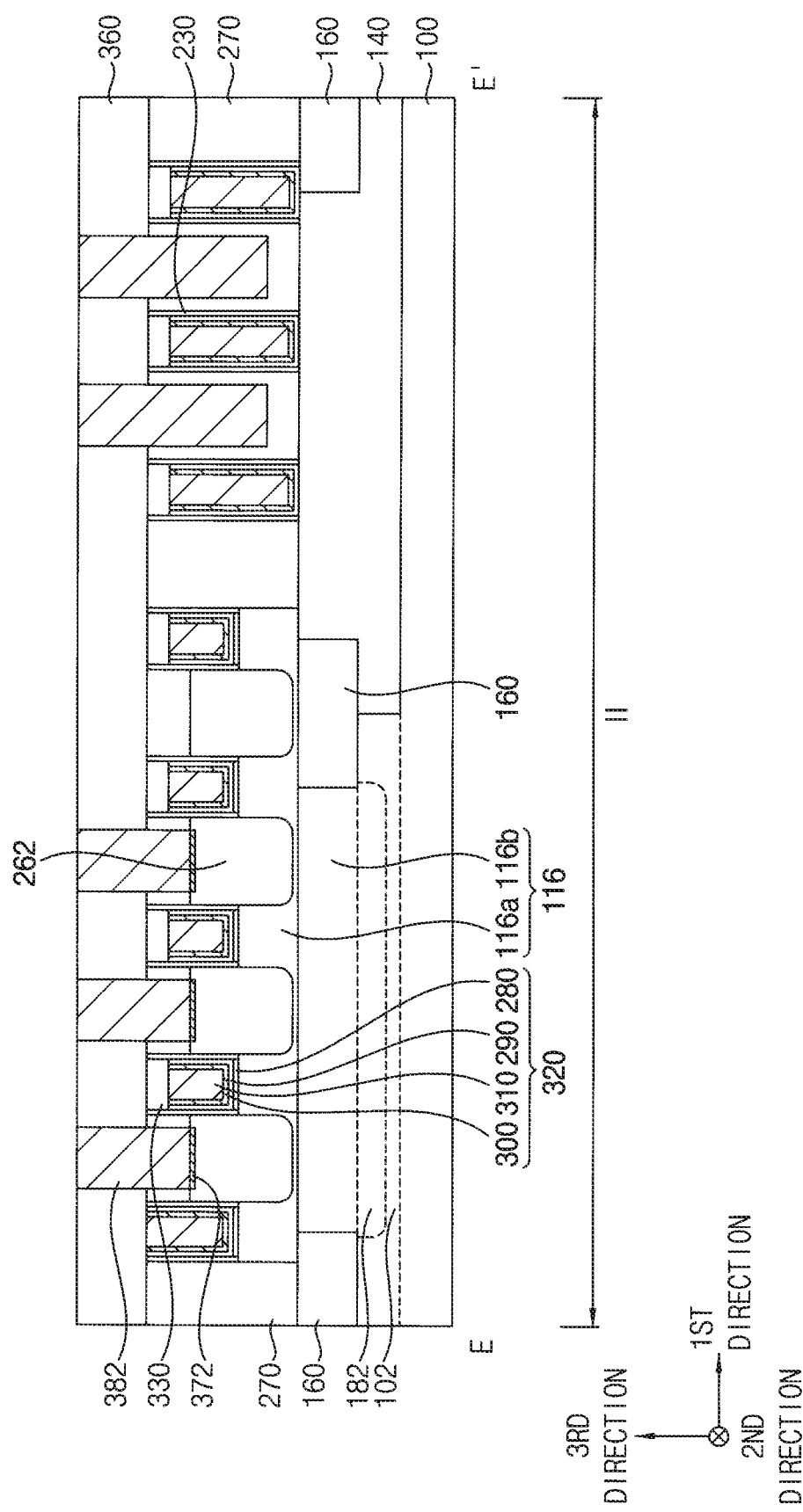

FIGS. 35 and 36 are a plan view and a cross-sectional view illustrating a semiconductor device in accordance with Third Comparative Embodiment.

This semiconductor device may be substantially the same as or similar to that of FIGS. 27 to 31 except for the location of the second diffusion prevention pattern 350.

Referring to FIGS. 35 and 36, the second diffusion prevention pattern 350 may be formed on the second region II of the substrate 100, but not formed on the first region I of the substrate 100.

Thus, the gate structure 320 of which a portion is converted into the second diffusion prevention pattern 350 may serve as a dummy gate structure, and a leakage current may be generated through the dummy gate structure.

The above semiconductor device may be applied to various types of memory devices including a diffusion prevention pattern. For example, the semiconductor device may be applied to logic devices such as central processing units (CPUs), main processing units (MPUs), and/or application processors (APs), or the like. Additionally, the semiconductor device may be applied to volatile memory devices such as DRAM devices and/or SRAM devices, and/or wiring structures of non-volatile memory devices such as flash memory devices, PRAM devices, MRAM devices, RRAM devices, or the like.

The foregoing is illustrative of the inventive concepts and is not to be construed as limiting thereof. Although some example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A semiconductor device, comprising:
 first group active fins, on a first region of a substrate, spaced apart from each other in a second direction, each of the first group active fins extending in a first direction, the first and second directions being different from each other, and the substrate including the first region and a second region; and
 a first diffusion prevention pattern on the first region of the substrate extending in the second direction through the first group active fins, wherein
  the first group active fins include first and second active fins,
  the first diffusion prevention pattern extends through a central portion of the first active fin in the first direction dividing the first active fin into a first portion and a second portion, and extends through and contacts an end of the second active fin in the first direction, and
  the first portion of the first active fin, the first diffusion prevention pattern, and the second portion of the first active fin are connected with each other to be continuous in the first direction.

2. The semiconductor device of claim 1, wherein the first group active fins include a plurality of second active fins spaced apart from each other in the second direction, and
 wherein the first diffusion prevention pattern extends through and contacts an end of each of the plurality of second active fins in the first direction.

3. The semiconductor device of claim 2, further comprising an insulation pattern at an opposite side to one of the plurality of second active fins adjacent the first active fin with respect to the first diffusion prevention pattern.

4. The semiconductor device of claim 1, further comprising a second diffusion prevention pattern extending through a central portion of the first active fin dividing the first active fin and through a central portion of the second active fin dividing the second active fin.

5. The semiconductor device of claim 1, further comprising:
second group active fins, on the second region of the substrate, spaced apart from each other in the second direction and extending in the first direction; and
a second diffusion prevention pattern on the second region of the substrate extending in the second direction through the second group active fins,
wherein the second group active fins include third and fourth active fins, and
wherein the second diffusion prevention pattern extends through a central portion of the third active fin in the first direction, and extends through an end of the fourth active fin in the first direction.

6. The semiconductor device of claim 5, wherein the first diffusion prevention pattern extends to the second region of the substrate in the second direction, contacting a sidewall of the second diffusion prevention pattern.

7. The semiconductor device of claim 6, further comprising a third diffusion prevention pattern, wherein,
the third diffusion prevention pattern is spaced apart from the first diffusion prevention pattern in the first direction, and
the third diffusion prevention pattern,
extends through a central portion of the first active fin dividing the first active fin and extends through a central portion of the second active fin dividing the second active fin on the first region of the substrate, and
extends through a central portion of the third active fin in the first direction dividing the third active fin and extends through an end of the fourth active fin to contact another sidewall of the second diffusion prevention pattern on the second region of the substrate.

8. The semiconductor device of claim 5, wherein a bottom of the first diffusion prevention pattern is closer to the substrate than a bottom of the second diffusion prevention pattern in a third direction, the third direction being substantially perpendicular to a surface of the substrate.

9. The semiconductor device of claim 5, wherein the first diffusion prevention pattern includes a nitride, and the second diffusion prevention pattern includes an oxide.

10. The semiconductor device of claim 5, further comprising:
gate structures spaced apart from each other in the first direction, extending in the second direction on the first and second group active fins; and
source/drain layers on portions of the first and second group active fins adjacent the gate structures,
wherein the first diffusion prevention pattern is between the gate structures.

11. The semiconductor device of claim 1, wherein,
the first region of the substrate is an NMOS region, and the second region of the substrate is an PMOS region, and
the first and second regions are disposed in the second direction.

12. A semiconductor device, comprising:
an active region on a substrate extending in a first direction and including a first portion, a second portion and a third portion, the first portion having a first width in a second direction substantially perpendicular to the first direction, the second portion having a second width in the second direction less than the first width, and the third portion being between the first and second portions and having a third width in the second direction less than the first width and more than the second width;
a first active fin on the first to third portions of the active region extending in the first direction to a first length;
a second active fin on the first portion of the active region extending in the first direction to a second length less than the first length; and
a first diffusion prevention pattern on the substrate extending in the second direction through the first and second active fins,
wherein the first diffusion prevention pattern extends through a central portion of the active fin in the first direction dividing the first active fin into a first portion and a second portion, and extends through and contacts an end of the second active fin in the first direction,
wherein the first portion of the first active fine, the first diffusion prevention pattern, and the second portion of the first active fin are connected with each other to be continuous in the first direction, and
wherein a distance in the second direction from a sidewall of the third portion of the active region to the first active fin is greater than a distance in the second direction from a sidewall of each of the first and second portions of the active region to the first active fin.

13. The semiconductor device of claim 12, further comprising an insulation pattern on the third portion of the active region, the insulation pattern being spaced apart from the first active fin.

14. The semiconductor device of claim 12, further comprising a plurality of third active fins, substantially similar to the second active fin, on the active region.

15. The semiconductor device of claim 12, wherein a bottom of the first diffusion prevention pattern is closer to the substrate than a bottom of the active region in a third direction, the third direction being substantially perpendicular to a surface of the substrate.

16. The semiconductor device of claim 12, further comprising a second diffusion prevention pattern spaced apart from the first diffusion prevention pattern in the first direction,
wherein the second diffusion prevention pattern extends through a central portion of the first active fin dividing the first active fin and extends through a central portion of the second active fin dividing the second active fin.

17. A semiconductor device, comprising:
first group active fins on a first region of a substrate spaced apart from each other in a second direction, each of the first group active fins extending in a first direction, the first and second directions being different from each other, and the substrate including the first region and a second region, the first group active fins comprising a first active fin and a second active fin;
a first diffusion prevention pattern on the first region of the substrate extending in the second direction through a central portion of the first active fin, dividing the first active fin in the first direction, and extending through an end of the second active fin in the first direction; and
a second diffusion prevention pattern on the first region of the substrate extending in the second direction, the second diffusion prevention pattern contacting a sidewall of the first diffusion prevention pattern, wherein
a bottom of the second diffusion prevention pattern is closer to the substrate in a third direction than a bottom of the first diffusion prevention pattern, and a top surface of the second diffusion prevention pattern is further from the substrate in the third direction than a top surface of the first diffusion prevention pattern, the third direction being substantially perpendicular to a surface of the substrate.

18. The semiconductor device of claim 17, further comprising a third diffusion prevention pattern substantially similar to the second diffusion prevention pattern, and spaced apart from the second diffusion prevention pattern,
   wherein one of the second and third diffusion prevention patterns contacts the sidewall of the first diffusion prevention pattern, and
   wherein the other one of the second and third diffusion prevention patterns extends through and contacts an end of the second active fin and contacts another sidewall of the first diffusion prevention pattern.

19. The semiconductor device of claim 17, further comprising second group active fins including third and fourth active fins spaced apart from each other in the second direction on the second region of the substrate, each of the third and fourth active fins extending in the first direction,
   wherein the first and second regions are disposed in the second direction, and
   wherein the second diffusion prevention pattern extends to the second region of the substrate, the second diffusion prevention pattern extending through a central portion of the first active fin in the first direction to divide the first active fin and extending through an end of the second active fin in the first direction.

* * * * *